(12) United States Patent
Lee et al.

(10) Patent No.: US 8,180,931 B2
(45) Date of Patent: May 15, 2012

(54) USB-ATTACHED-SCSI FLASH-MEMORY SYSTEM WITH ADDITIONAL COMMAND, STATUS, AND CONTROL PIPES TO A SMART-STORAGE SWITCH

(75) Inventors: Charles C. Lee, Cupertino, CA (US); Frank Yu, Palo Alto, CA (US); Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 217 days.

(21) Appl. No.: 12/651,334

(22) Filed: Dec. 31, 2009

(65) Prior Publication Data

US 2010/0122021 A1 May 13, 2010

Related U.S. Application Data

(63) Continuation-in-part of application No. 12/254,428, filed on Oct. 20, 2008, now Pat. No. 7,849,242, and a continuation-in-part of application No. 10/803,597, filed on Mar. 17, 2004, now Pat. No. 7,457,897, and a continuation-in-part of application No. 11/377,235, filed on Mar. 15, 2006, now Pat. No. 7,631,195, and a continuation-in-part of application No. 11/466,759, filed on Aug. 23, 2006, now Pat. No. 7,702,831, and a continuation-in-part of application No. 11/685,143, filed on Mar. 12, 2007, now Pat. No. 7,873,837, and a continuation-in-part of application No. 12/347,306, (Continued)

(51) Int. Cl.
*G06F 3/00* (2006.01)
*G06F 5/00* (2006.01)
(52) U.S. Cl. ...................... 710/14; 710/5; 710/8; 710/62
(58) Field of Classification Search .................. None
See application file for complete search history.

(56) References Cited

U.S. PATENT DOCUMENTS

2002/0156952 A1 * 10/2002 Shono .......................... 710/104

(Continued)

OTHER PUBLICATIONS

Kannon, Shakthi, USB Mass Storage Class Bulk-only Transfer, 2007, Free Software Foundation, [online, accessed on Sep. 8, 2011], URL: http://www.shakthimaan.com/downloads/usb/usb-msc-0.2.pdf.*

*Primary Examiner* — Scott Sun
(74) *Attorney, Agent, or Firm* — Stuart T. Auvinen; gPatent LLC

(57) ABSTRACT

An electronic flash-memory card has additional pipes for commands and status messages so that data pipes are not clogged with commands and status messages, allowing for a higher data throughput. The command and status pipes are activated when a UAS/BOT detector detects that a host is using a USB-Attached-SCSI (UAS) mode rather than a Bulk-Only-Transfer (BOT) mode. The host can send additional commands and data without waiting for completion of a prior command when operating in UAS mode but not while operating in BOT mode. A command queue (CQ) in the device re-orders commands for accessing flash memory and merges data in a RAM buffer. Smaller 1 KB USB packets in the data pipes are merged into larger 8 KB payloads in the RAM buffer, allowing for more efficient flash access.

13 Claims, 32 Drawing Sheets

Related U.S. Application Data filed on Dec. 31, 2008, now Pat. No. 8,112,574, and a continuation-in-part of application No. 11/926,636, filed on Oct. 29, 2007, now Pat. No. 7,657,692, and a continuation-in-part of application No. 12/576,216, filed on Oct. 8, 2009, and a continuation-in-part of application No. 12/124,081, filed on May 20, 2008, now Pat. No. 7,872,873, and a continuation-in-part of application No. 11/927,549, filed on Oct. 29, 2007, now Pat. No. 7,440,286, and a continuation-in-part of application No. 11/876,597, filed on Oct. 22, 2007, now Pat. No. 7,815,469, and a continuation-in-part of application No. 11/874,767, filed on Oct. 18, 2007, now Pat. No. 8,021,166, and a continuation-in-part of application No. 11/866,927, filed on Oct. 3, 2007, now Pat. No. 8,043,099, and a continuation-in-part of application No. 11/864,696, filed on Sep. 28, 2007, now Pat. No. 8,073,985, and a continuation-in-part of application No. 10/761,853, filed on Jan. 20, 2004, now abandoned, and a continuation-in-part of application No. 10/789,333, filed on Feb. 26, 2004, now Pat. No. 7,318,117, and a continuation-in-part of application No. 11/623,863, filed on Jan. 17, 2007, now Pat. No. 7,814,337.

(56) References Cited

U.S. PATENT DOCUMENTS

2003/0041188 A1* 2/2003 Han et al. .................. 710/11

* cited by examiner

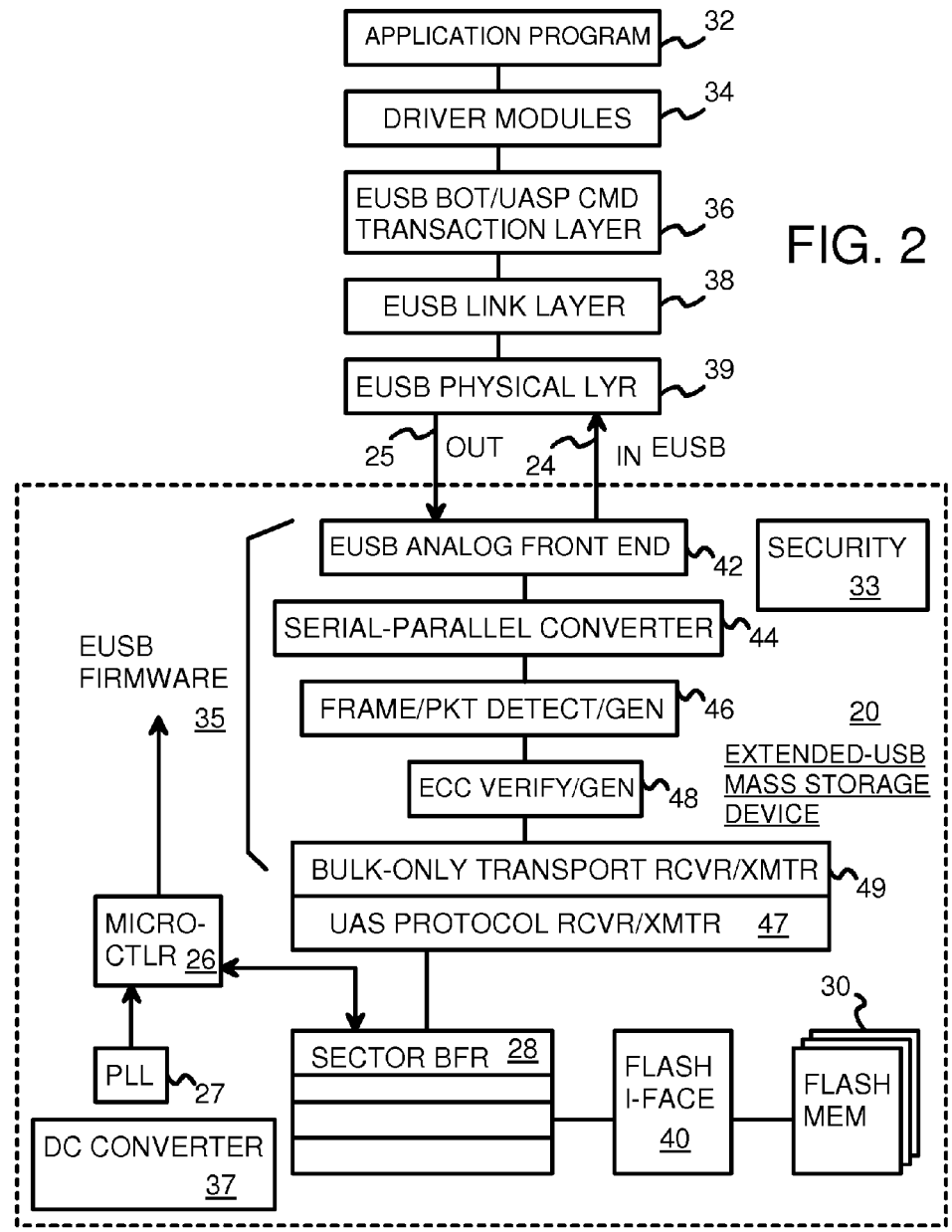

UAS MODE

SEQ# 905 CMD SEQUENCE FROM UAS HOST

| | | | |
|---|---|---|---|
| 1 | WR CMD 1 | START LBA=3 | LEN=10 PKTS |
| 2 | WR CMD 2 | START LBA=5 | LEN=20 PKTS |
| 3 | WR CMD 3 | START LBA=3 | LEN= 5 PKTS |
| 4 | RD CMD 4 | START LBA=5 | LEN=10 PKTS |
| 5 | RD CMD 5 | START LBA=3 | LEN= 5 PKTS |

USB-ATTACHED-SCSI FLASH-MEMORY SYSTEM WITH ADDITIONAL COMMAND, STATUS, AND CONTROL PIPES TO A SMART-STORAGE SWITCH

RELATED APPLICATION

This application is a continuation-in-part (CIP) of "PCI EXPRESS-COMPATIBLE CONTROLLER AND INTERFACE FOR FLASH MEMORY", U.S. Ser. No. 12/254,428, filed on Oct. 20, 2008; which is a Division of "PCI EXPRESS-COMPATIBLE CONTROLLER AND INTERFACE FOR FLASH MEMORY", U.S. application Ser. No. 10/803,597, filed on Mar. 17, 2004, now U.S. Pat. No. 7,457,897.

This application is also a CIP of co-pending U.S. patent application for "SYSTEM AND METHOD FOR PROVIDING SECURITY TO A PORTABLE STORAGE DEVICE", U.S. application Ser. No. 11/377,235, filed on Mar. 15, 2006.

This application is also a CIP of "FLASH MEMORY CONTROLLER FOR ELECTRONIC DATA FLASH CARD", U.S. application Ser. No. 11/466,759, filed on Aug. 23, 2006.

This application is a continuation-in-part (CIP) of co-pending U.S. patent application for "HIGH-LEVEL BRIDGE FROM PCIE TO EXTENDED USB" Ser. No. 11/926,636, filed on Oct. 29, 2007.

This application is also a CIP of co-pending U.S. patent application for "DATA SECURITY FOR ELECTRONIC DATA FLASH CARD", U.S. application Ser. No. 11/685,143, filed on Mar. 12, 2007.

This application is CIP for "Swappable Sets of Partial-Mapping Tables in a Flash-Memory System With A Command Queue for Combining Flash Writes", Ser. No. 12/347,306, filed on Dec. 31, 2008.

This application is CIP of "Flash-Memory System with Enhanced Smart-Storage Switch and Packed Meta-Data Cache for Mitigating Write Amplification by Delaying and Merging Writes until a Host Read" U.S. application Ser. No. 12/576,216, filed on Oct. 8, 2009.

This application is CIP of "Extended COB-USB with Dual Personality Contacts" U.S. application Ser. No. 12/124,081, filed on May 20, 2008.

This application is CIP of "Extended USB Dual-Personality Card Reader" U.S. application Ser. No. 11/927,549, filed on Oct. 29, 2007.

This application is CIP of "Dual-Personality Extended USB Plugs and Receptacles Using With PCBA and Cable Assembly" U.S. application Ser. No. 11/876,597, filed on Oct. 22, 2007.

This application is CIP of "Extended USB Plug, USB PCBA, and USB Flash Drive With Dual-Personality for Embedded Application with Mother Boards" U.S. application Ser. No. 11/874,767, filed on Oct. 18, 2007.

This application is CIP of "Extended USB Plug, USB PCBA and USB Flash Drive with Dual-Personality" U.S. application Ser. No. 11/866,927, filed on Oct. 3, 2007.

This application is CIP of "Backward Compatible Extended USB Plug And Receptacle With Dual Personality" U.S. application Ser. No. 11/864,696, filed on Sep. 28, 2007.

This application is CIP of "HIGHLY INTEGRATED MASS STORAGE DEVICE WITH AN INTELLIGENT FLASH CONTOLLER" U.S. application Ser. No. 10/761,853, filed on Jan. 20, 2004.

This application is CIP of "SYSTEM AND METHOD FOR CONTROLLING FLASH MEMORY" U.S. application Ser. No. 10/789,333, filed on Feb. 26, 2004.

This application is CIP of "Secure Flash-Memory Card Reader with Host-Encrypted Data on a Flash-Controller-Mastered Bus Parallel to a Local CPU Bus Carrying Encrypted Hashed Password and User ID" U.S. application Ser. No. 11/623,863, filed on Jan. 17, 2007.

FIELD OF THE INVENTION

This invention relates to solid-state disks (SSD), and more particularly to accessing flash memory drives using data, command, status, and control pipes when operating in an extended mode.

BACKGROUND OF THE INVENTION

Small, portable devices such as personal digital assistants (PDA), multi-function cell phones, digital cameras, music players, etc. have become widely available. These devices use a central processing unit (CPU) or microcontroller and a mass-storage memory such as a hard drive or flash memory. These small devices are often cost and size sensitive.

FIG. 1A is a schematic circuit block diagram illustrating an electronic data storage medium disclosed in the parent application. The electronic data storage medium with fingerprint verification capability can be accessed by external computer 9 using input/output interface circuit 5, which may use a Universal Serial Bus (USB) or similar interface. The electronic data storage medium can be located inside or outside of the external computer. Card reader 6 may be attached to external computer 9 or may act as a substitute for external computer 9 through the host computer link with a Universal-Serial-Bus (USB) USB-Attached-SCSI (UAS) bus, which has one set of two pairs of differential serial buses:

(i) a first pair differential serial bus with a first pin carry + signal and a second pin carry − signal, and (ii) a second pair differential serial bus with a first pin carry + signal and a second pin carry − signal.

Card reader 6 accepts card body 1. The card reader interface can connect with various standard bus such as Secure Digital (SD) bus, Compact Flash (CF) card, Serial ATA (SATA) bus, Serial SCSI (SAS) bus, etc.

The electronic data storage medium is packaged in card body 1, and includes processing unit 2, memory device 3, security unit 4, and input/output interface circuit 5.

Memory device 3 can be a flash memory device that stores data files. Security and encryption/decryption unit 4 can assist with AES, IEEE 1667, fingerprint, or other kinds of security functions, such as encryption and description and password verification or management. Processing unit 2 connects to other components and can operate in various modes, such as a programming mode, a data retrieving mode, and a data-resetting mode. Power source 7 can be a DC-DC converter that converts from a higher voltage, such as 5 volts, to a lower voltage such as 3.3 or 1.8 volts or some other value that can be used by other units.

The electronic data storage medium packaged in card body 1 includes processing unit 2, memory device 3, and input/output interface circuit 5. While useful, various additions can increase the usefulness of the device. For example, audio playback can be supported. When coupled with security unit 4, the audio playback can have added security features.

Memory device 3 may be a solid-state flash memory rather than a rotational hard drive. Using flash memory provides lighter weight, lower power, and more rigidity than the rotational hard drive. Data files such as audio, video, and text may need security. Also, alternative features such as audio/video capability may replace the fingerprint verification feature on some alternatives of the device.

Hard disks and other mass storage devices are being replaced or supplemented with solid-state mass storage such as flash memories. Flash memories use non-volatile memory cells such as electrically-erasable programmable read-only memory, (EEPROM), but are not randomly accessible at the byte level. Instead, whole pages or sectors of 512 bytes or more are read or written together as a single page. NAND flash memory is commonly used for data storage of blocks. Pages in the same block may have to be erased together, and limitations on writing may exist, such as only being allowed to write each page once between erases.

These small portable electronic devices often are able to connect to a host computer such as a personal computer (PC). While a proprietary connector may be used, a connector for a standard expansion bus is preferable. Universal-Serial Bus (USB) is often used to connect such portable flash-memory devices to a PC.

The USB 3.0 bus standard uses two pairs of differential lines that are time-duplexed, or used for transmission in both directions, but at different times. This may limit performance when data needs to be sent in both directions at the same time. The older USB 2.0 standard provides that the host, such as the PC, controls the bus as the bus master, while USB devices plugged into the host act as slave devices. A USB controller on the host PC generates data transfer transactions and waits for USB devices to respond, either by transmitting requested data to the host, or by writing host data into the USB device's memory.

Often a host system contains several different buses. For example, the host may have a Peripheral Components Interconnect Express (PCIE) bus, a Universal-Serial Bus (USB), an Integrated Device Electronics (IDE) bus, and an AT bus. Peripherals using the Small-Computer System Interface (SCSI) that connect to a host through USB are known as USB-Attached-SCSI (UAS).

Some buses may be enhanced with a revised version of the protocol specification. For example, USB has a version 2.0 and a newer version 3.0 that improves performance by using a full-duplex differential bus, and by eliminating polling. In the future when the interface needs more bandwidths such as 40 Gbps and the copper wires cannot support the necessary speed, high bandwidth fiber with optical, either single-mode or multi-mode, may be used.

For the situation of USB using the optical fiber communication protocol, the flash memory controller of an electronic flash memory card is operable selectively in a programming mode, a data retrieving mode, and a resetting mode. When the flash memory controller is in the programming mode, the flash memory controller activates the input/output interface circuit to receive the data file from the host computer, and to store the data file in the flash memory device. A programming mode in which the flash memory controller activates the input/output interface circuit to receive the data file from the host computer, and to store the data file in a physical address of the flash memory device associated with a logical address and transfer length received with a USB optical protocol write command issued from the host computer to the flash memory controller. When the flash memory controller is in the data retrieving mode, the flash memory controller activates the input/output interface circuit to transmit the data file read from the flash memory device to the host computer. A data retrieving mode in which the flash memory controller receives a USB optical protocol read command issued from the host computer including the logical address and transfer length, and activates the input/output interface circuit to transmit the data file read from the physical address of the flash memory device associated with the logical address to the host computer. In the data resetting mode, the data file is erased from the flash memory device. A data resetting mode in which data from one or more memory cells is erased from the flash memory device, wherein the data resetting mode is initiated and performed by the flash memory controller after receiving the USB optical protocol write command using arbitration logic and data that is stored on the flash memory device.

Devices to convert one bus type to another bus type are known as bridges. Legacy host systems are not equipped for the newer bus protocols since these legacy systems are older and were designed before the new bus protocols were available.

Bridges are often slow since all protocol layers may be present and are traversed. Data packets must flow up through the stack of protocol layers and then back down another stack of protocol layers for the other bus. When multiple bus standards are present on a host system, several bridges may be used in series, causing increased delays for multiple successive format conversions by multiple bridge devices.

The parent application, U.S. Ser. No. 11/926,636 described a bridge to the new USB 3.0, or Enhanced USB (EUSB) as it was described therein.

FIG. 1B is a block diagram of host with a EUSB receptacle that supports single-mode EUSB communication. EUSB card 934 could be plugged into EUSB receptacle 950 of host 951. Host 951 could be a cell phone or a digital camera, etc. EUSB receptacle 950 supports single-mode EUSB communication.

Host 951 has a processor system 968 for executing programs including EUSB management and no-polling programs. EUSB protocol processor 960 performs protocol processing such as conversions to EUSB or USB 3.0 over bus 903 for host processor system 968.

EUSB card 934 is a EUSB device with a plug that supports EUSB communication. EUSB card 934 has EUSB protocol processor 980 for executing programs including device initializations and bus-response programs. Single-personality bus interface 973 communicates processed data from EUSB protocol processor 980 using the EUSB protocol to its plug 970. Data is ultimately stored in flash memory 990.

FIG. 1C is a block diagram of a USB UAS card reader with a flash-serial buffer bus in parallel with the CPU bus. One or more flash-card controllers 850, 854 connect to both CPU bus 838 and to flash-serial buffer bus 840. When a flash-memory card is inserted, embedded, or surface mounted into slot A of card reader 200, flash-card controller 850 can transfer data, while when a flash-memory card is inserted into slot B, flash-card controller 854 can transfer data. CPU 10 sends commands over CPU bus 38 to flash-card controllers 850, 854 using their slave ports 851, 855 and CPU master port 815.

What is desired is a solid-state-drive (SSD) that has extra pipes for commands, status, and control to allow data pipes to pass data through with a higher bandwidth. It is desired to use these extra pipes for extended modes of operation. It is desired to use the extra pipes for extended modes such as UAS mode when EUSB, or USB 3.0 is supported. It is also desired to support legacy host systems such as USB 2.0 by sending commands, status, and control through the data pipes for these legacy hosts.

SUMMARY OF THE INVENTION

In accordance with one embodiment of the present invention, the flash memory controller of an electronic flash memory card is operable selectively in a programming mode, a data retrieving mode, and a resetting mode. When the flash memory controller is in the programming mode, the flash memory controller activates the input/output interface circuit to receive the data file from the host computer, and to store the data file in the flash memory device. A programming mode in which the flash memory controller activates the input/output interface circuit to receive the data file from the host computer, and to store the data file in a physical address of the flash memory device associated with a logical address and transfer length received with a USB BOT or UAS write command issued from the host computer to the flash memory controller. When the flash memory controller is in the data retrieving mode, the flash memory controller activates the input/output interface circuit to transmit the data file read from the flash memory device to the host computer. A data retrieving mode in which the flash memory controller receives a USB BOT or UAS read command issued from the host computer including the logical address and transfer length, and activates the input/output interface circuit to transmit the data file read from the physical address of the flash memory device associated with the logical address to the host computer. In the data resetting mode, the data file is erased from the flash memory device. A data resetting mode in which data from one or more memory cells is erased from the flash memory device, wherein the data resetting mode is initiated and performed by the flash memory controller after receiving the USB BOT or UAS write command using arbitration logic and data that is stored on the flash memory device.

In accordance with another embodiment of the present invention, a USB flash device transfers high-speed data between computers using the Bulk-Only Transfer (BOT) protocol. BOT is a more efficient and faster transfer protocol than CBI protocol because BOT transport of command, data, status rely on Bulk endpoints in addition to default Control endpoints.

In accordance with another embodiment of the present invention, a USB flash device transfers high-speed data between computers using the USB Attached SCSI (UAS) protocol. UAS is a more efficient and faster transfer protocol than BOT protocol because UAS transport of command, data, status rely on Bulk endpoints of Command, Status, Data-In, and Data-Out in addition to default Control endpoints.

Because data storing and reading in a flash memory device is necessary for access and verification purpose, speed is also a major concern of the device performance. According to additional aspects of the present embodiment set forth below, a method of dual-channel parallel and interleave access flash is implemented in an electronic data flash card for faster performance than is possible using conventional methods.

A typical electronic data flash card uses a flash memory with single-channel (8-bit) data bus. With multiple-channel data bus, more data bits can be read from or write to the flash memories simultaneously, thereby the access speed is enhanced. For example, dual-channel (16-bit) data bus can double the access speed to the flash memory, quad-channel (32-bit) data can increase the access speed by 4 times, and so on. Electronic data flash cards with dual-channel data width can be realized by one 16-bit wide flash memory, by two 8-bit wide flash memories via a single control, or by two 8-bit wide flash memories via separate controls as illustrated in FIGS. 10-12.

BRIEF DESCRIPTION OF THE DRAWINGS

FIG. 2 shows an extended USB device connected to a EUSB host.

DETAILED DESCRIPTION

Figure 1A:
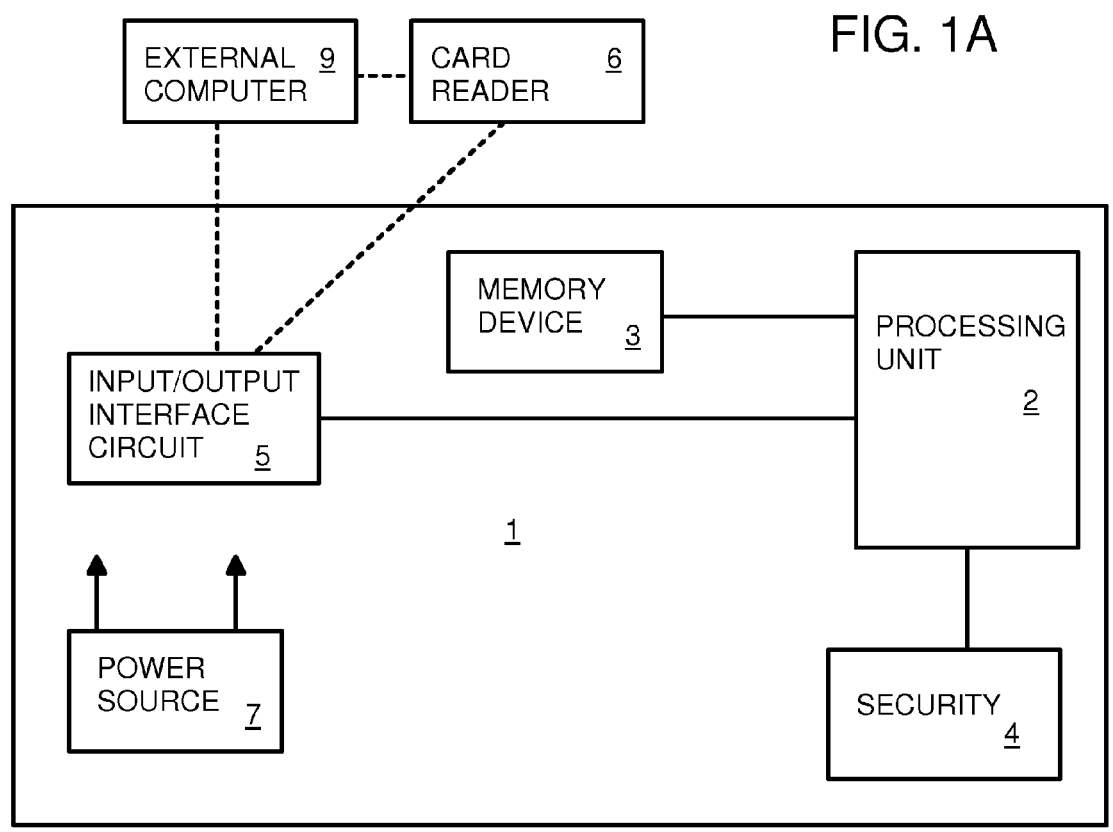
FIG. 1A is a schematic circuit block diagram illustrating an electronic data storage medium disclosed in the parent application.
Figure 1B:
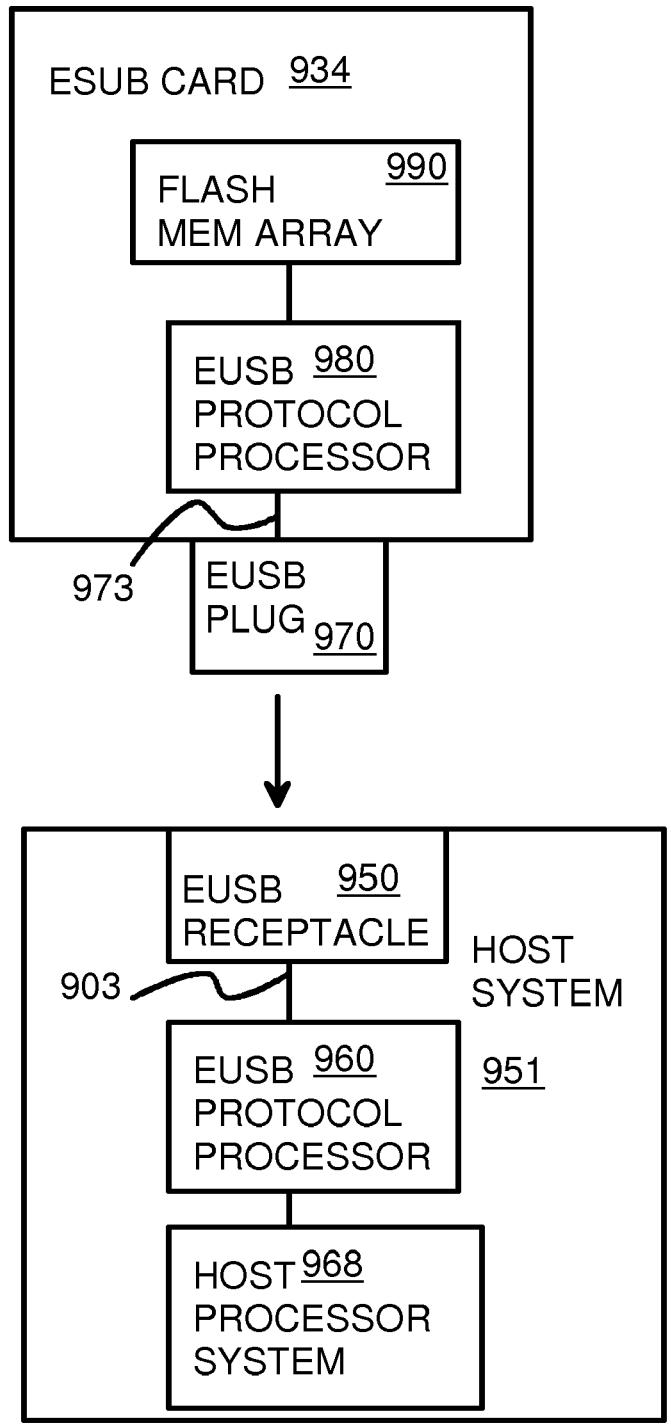
FIG. 1B is a block diagram of host with a EUSB receptacle that supports single-mode EUSB communication.
Figure 1C:
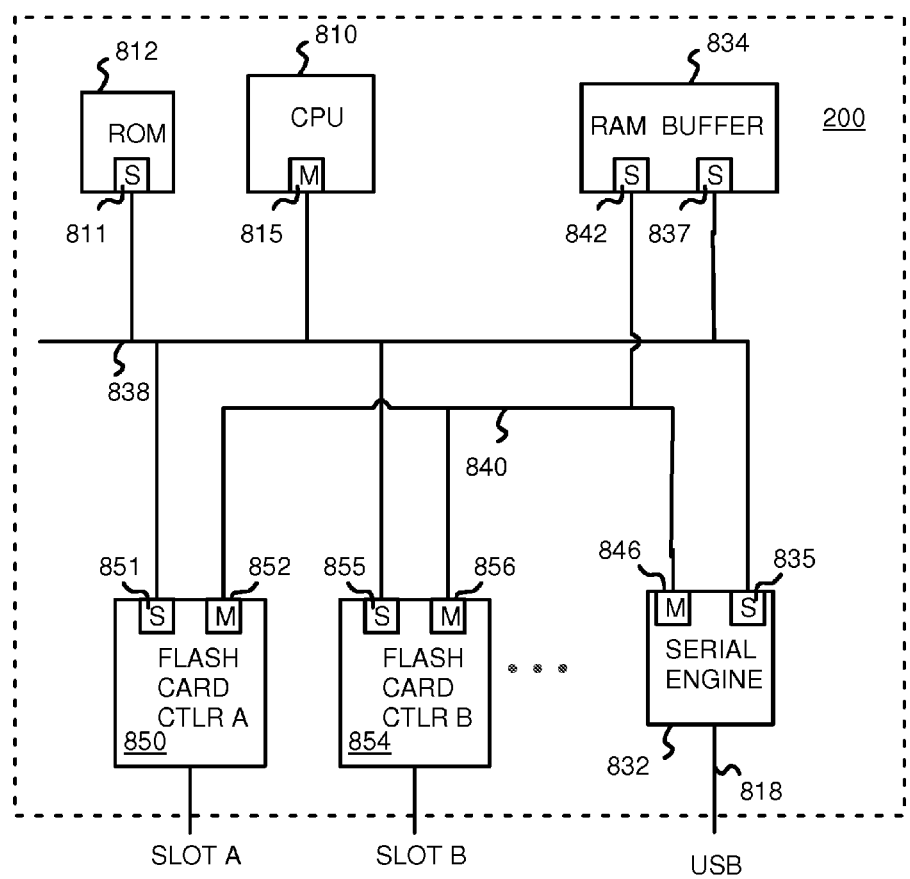
FIG. 1C is a block diagram of a USB UAS card reader with a flash-serial buffer bus in parallel with the CPU bus.

The present invention relates to an improvement in solid-state-drive (SSD) flash architectures. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

FIG. 2 shows an extended USB device connected to a EUSB host. Application program 32 on a host needs to read data that is stored in flash memory 30 on EUSB device 20. Application program 32 sends a data-read request to a device driver for the flash in device modules 34, which activate EUSB Bulk-Only-Transfer (BOT) and UAS command transaction layer 36. EUSB bulk-only-transport and command transaction layer 36 embed a read command inside a EUSB data payload and header using the bulk-only-transport mode of USB. A cyclical-redundancy-check (CRC) checksum is also attached.

EUSB link layer 38 adds a sequence number and another CRC checksum, while EUSB physical layer 39 adds packet framing and performs 8/10-bit encoding. The framed data packet is sent from the host to EUSB device 20 over OUT differential pair 25.

EUSB analog front end 42 senses the data transitions on OUT differential pair 25, extracts the clock, and sends serial data to serial-parallel converter 44, which generates parallel data words. The parallel data words are examined by frame and packet detector 46 to locate frame and packet boundaries. The header and data payload can be located by bulk-only-transport receiver 49, ECC generator/checker 48 checks CRC's for error detection. The data payloads can be written into sector buffer 28.

Microcontroller 26 examines the headers and data payloads from bulk-only-transport receiver 49 and detects the read command. Microcontroller 26 activates flash interface 40 to perform a read of flash memory 30, and the flash data read is transferred into sector buffer 28. This flash data in sector buffer 28 is formed into data payloads, a header attached by bulk-only-transport receiver 49, and passed back down the layers for transmission to the host over IN differential pair 24. Security and encryption/decryption unit 33 can assist with AES, IEEE 1667, fingerprint, or other kinds of security functions, such as encryption and description and password verification or management. Power source 37 can be a DC-DC converter that converts from a higher voltage, such as 5 volts, to a lower voltage such as 3.3 or 1.8 volts or some other value that can be used by other units.

Phase-locked loop (PLL) 27 may be driven by an external crystal (not shown) and generates an internal clock to microcontroller 26 and other components such as sector buffer 28. Microcontroller 26 controls operation of EUSB firmware 35 that may include bulk-only-transport receiver 49, ECC generator/checker 48, frame and packet detector 46, serial-parallel converter 44, and EUSB analog front end 42.

When the host supports USB-Attached-SCSI (UAS), UAS protocol transmitter/receiver 47 can be activated rather than bulk-only-transport (BOT) receiver 49. In UAS mode, commands, status, and control are routed to separate pipes, while in BOT mode these commands, status, and control are routed to the data pipes. A lower bandwidth is achieved when commands, status, and control are routed through the data pipes, since some delay of data packets can occur. Thus UAS can achieve a higher bandwidth that BOT.

Firmware 35 may perform security processing by indicating to the host that it is a high-security device such as an Advanced Encryption Standard (AES) 128/192/256 or IEEE 1667 device with a digital signature method AES or IEEE 1667 device during the enumeration process. If the password has not been set in the device, a USB 3.0 driver on the host can ask the user for a strong password, which is encrypted and stored by the device. When a password has already been set on the device, the host can ask for the password from the user, and verify the entered password to the stored encrypted password before the contents of the device are accessible to the host. When too many password mismatches occur, such as 5, then the device can format itself to make its contents unreadable.

Figure 3:
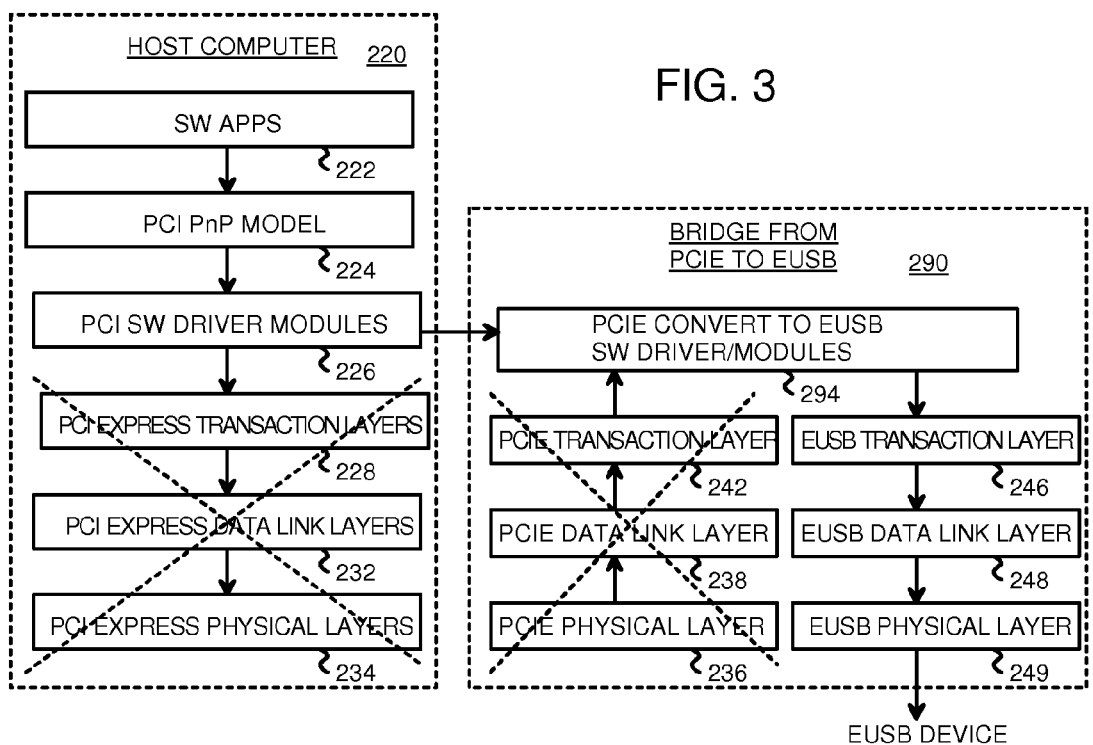
FIG. 3 is a diagram of a host that connects to an EUSB device through a high-level integrated PCIE-to-EUSB bridge.

FIG. 3 is a diagram of a host that connects to an EUSB device through a high-level integrated PCIE-to-EUSB bridge. Host computer 220 connects to an EUSB device (not shown) through high-level integrated PCIE-to-EUSB bridge 290. High-level integrated PCIE-to-EUSB bridge 290 connects to an EUSB device over an EUSB bus that has two differential pairs of lines for full-duplex transfers. Software application programs 222 on host 220 read data that is stored in flash memory on the EUSB device by first converting a PCIE transaction into a EUSB transaction using high-level integrated PCIE-to-EUSB bridge 290. This bridge can be integrated into the SSD or host or can be a separate device.

Software application programs 222 use high-level application-programming interface (API) calls to send I/O requests. These I/O requests are converted at a high layer of PCIE to EUSB packets by high-level integrated PCIE-to-EUSB bridge 290 and passed on to the EUSB device for reading the flash memory. The I/O request are not first converted to physical PCIE signals, skipping PCIE transaction layers 228, PCIE data link layers 232, and PCIE physical layers 234 on host 220. Skipping PCIE transaction layers 228, PCIE data link layers 232, and PCIE physical layers 234 on host 220 reduces delays.

PCI plug-n-play model 224 initializes, enumerates, and configures all PCIE devices and ports that are attached to the host, including a direct high-level PCIE connection to high-level integrated PCIE-to-EUSB bridge 290. PCI software driver modules 226 manage PCI bus transactions generated in response to higher-level requests from software application programs 222, including a direct high-level PCIE connection to high-level integrated PCIE-to-EUSB bridge 290.

High-level PCIE requests are sent directly from PCI software driver modules 226 to high-level direct bridging converter modules 294 in high-level integrated PCIE-to-EUSB bridge 290.

High-level direct bridging converter modules 294 convert the PCIE data payload in the PCIE request from PCI software driver modules 226 into a EUSB data payload. Any embedded commands for the flash memory are treated as data by high-level direct bridging converter modules 294.

The converted EUSB data payload is sent from high-level direct bridging converter modules 294 to EUSB transaction layers 246, which adds an EUSB header and CRC, and passed back down to EUSB data-link layer 248 which adds sequence numbers and another CRC. Finally EUSB physical layer 249 performs framing, encoding, serializing, and physically drives the differential OUT lines of the EUSB bus that connects to the EUSB device.

While connecting a legacy host through a PCIE-to-EUSB bridge is effective for older legacy computers, additional delay and latency is added by the many layers 228, 232, 234 on host 220, and layers 236, 238, 242 on high-level integrated PCIE-to-EUSB bridge 290. These additional delays are eliminated in the embodiment of FIG. 3 by using high-level direct bridging converter modules 294, which directly receives PCIE data payloads and requests from PCI software driver modules 226.

Skipping PCIE transaction layers 228, PCIE data link layers 232, and PCIE physical layers 234 on host 220 reduces delays. Also, skipping PCIE physical layer 236, PCIE data link layers 238, and PCIE transaction layers 242 on high-level integrated PCIE-to-EUSB bridge 290 further reduces delays.

Direct conversion from UAS to USB can also occur without conversion to and from PCIE. Avoiding PCIE conversions can reduce delays. This concept can be applied to SSD that supports UAS mode using USB 3.0 (previously called EUSB) for physical transfers.

Figure 4A:
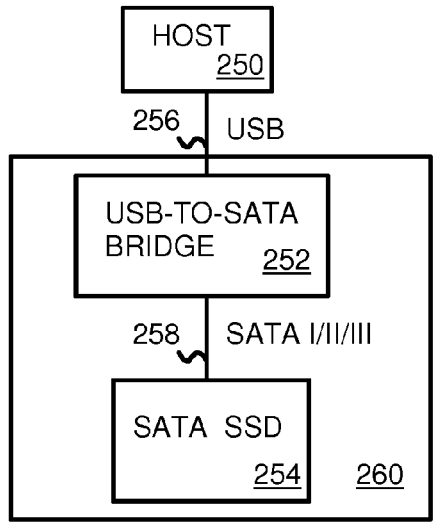
FIG. 4A shows a host using a USB-to-SATA bridge to access a SATA SSD.

FIG. 4A shows a host using a USB-to-SATA bridge to access a SATA SSD. Host 250 uses USB 3.0 or USB 2.0 to communicate over USB physical bus 256 to peripheral device 260.

Peripheral device 260 stores data in SATA SSD 254. USB-to-SATA bridge 252 converts USB commands and data received over USB physical bus 256 to SATA commands and data that are sent over SATA bus 258 to SATA SSD 254.

SATA bus 258 can support Serial AT-Attachment (SATA) I, which operates at 1.5 Gbps, SATA II, which operates at 3 Gbps, and SATA III, which operates at 6 Gbps. SATA SSD 254 can be a SCSI drive, allowing host 250 to use a UAS mode or protocol for USB-Attached-SCSI (UAS). Alternately, Serial-Attached SCSI (SAS) may be used. Bridge 252 can be a USB-TO-SAS BRIDGE, bus 258 can be a SAS interface and SSD 254 can be SAS SSD.

Figure 4B:
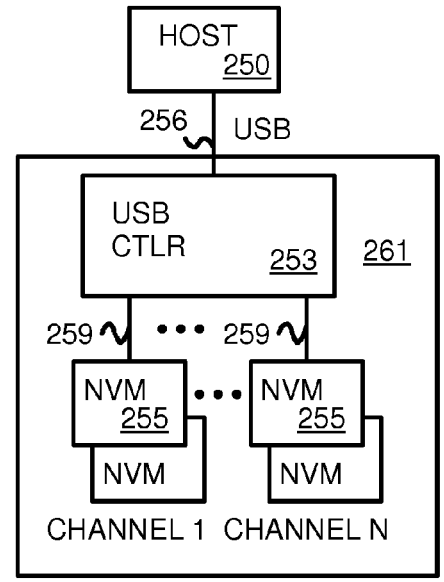
FIG. 4B shows a host using a USB controller to access a NVM.

FIG. 4B shows a host using a USB controller to access a NVM. Host 250 uses USB 3.0 or USB 2.0 to communicate over USB physical bus 256 to peripheral device 261.

Peripheral device 261 stores data in Non-Volatile Memory (NVM) 255. NVM 255 are organized into two or more channels that can allow for simultaneous or overlapping access, increasing throughput.

USB controller 253 converts USB commands and data received over USB physical bus 256 to flash commands and data that are sent over flash buses 259 to NVM 255. Data are mapped to the multiple channels of NVM 255 by USB controller 253 or by mapping logic (not shown).

Figure 5:
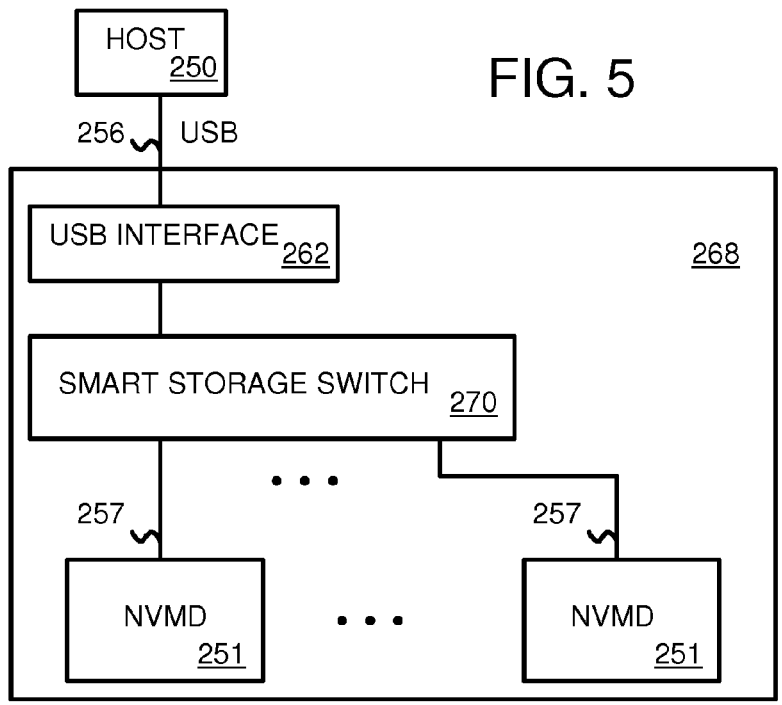
FIG. 5 shows a host using a Smart Storage Switch to access multiple NVMD.

FIG. 5 shows a host using a Smart Storage Switch to access multiple NVM Devices (NVMD). Host 250 uses USB 3.0 or USB 2.0 to communicate over USB physical bus 256 to peripheral device 268.

Peripheral device 268 stores data in multiple NVMD 251. USB interface 262 converts USB commands and data received over USB physical bus 256 to SATA commands for Smart Storage Switch 270 and data that are sent over buses 257 to NVMD 251.

Smart Storage Switch 270 maps the data to multiple NVMD 251 and overlaps accesses to improve throughput.

Figure 6:
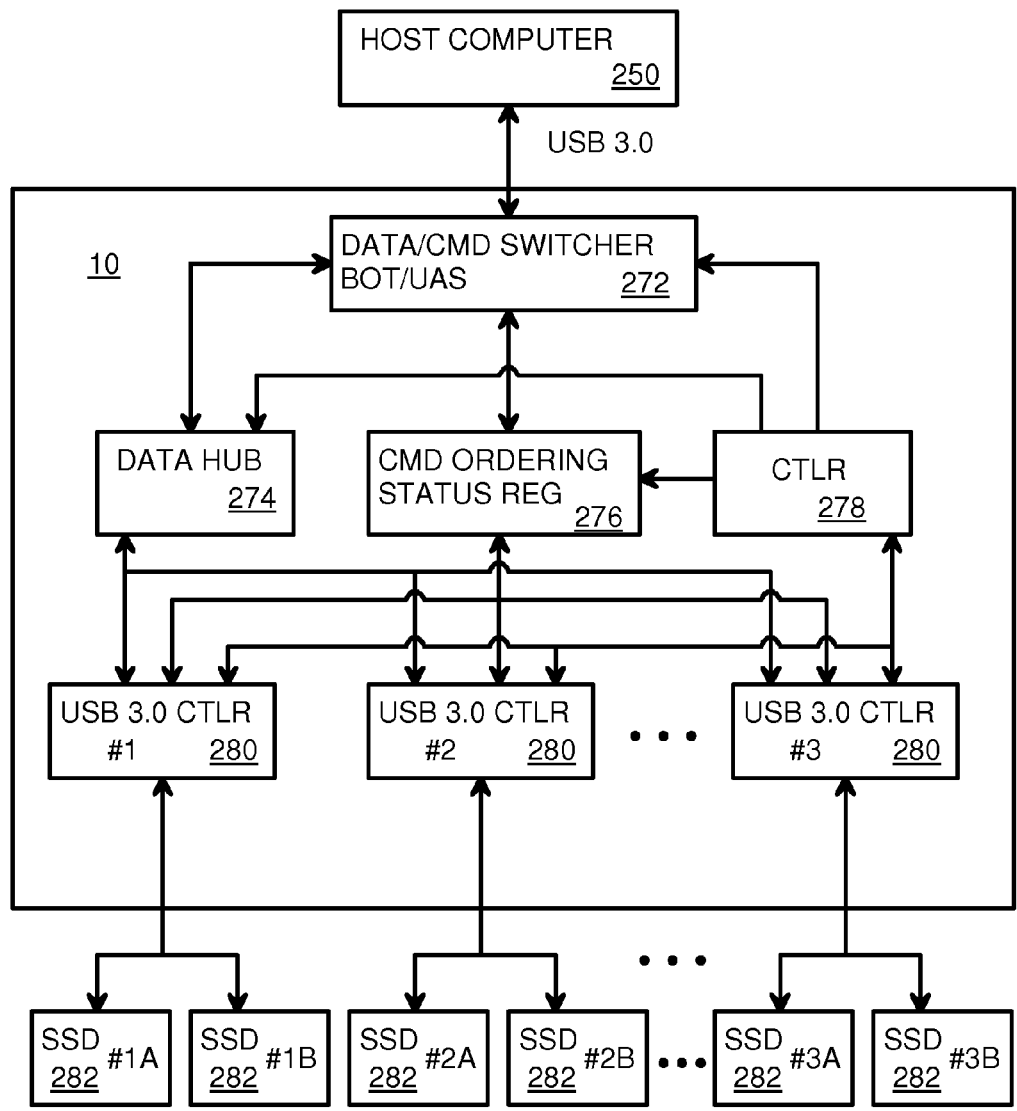
FIG. 6 shows a data manager for accessing multiple SSD's.

FIG. 6 shows a data manager for accessing multiple SSD's. Host 250 uses the USB 3.0 protocol to communicate with data manager 10. Data manager 10 can be a Smart Storage Switch that provides a RAID 1 function for each channel. Data manager 10 can also support RAID 0, 5, 6 in some embodiments. Data/command switcher 272 is controlled by controller 278 to route data to and from data pipes in data hub 274. In a Bulk-Only-Transport (BOT) mode, also known as bulk mode, data/command switcher 272 also routes commands and status through the data pipes in data hub 274. However, in UAS mode, data/command switcher 272 routes commands to a command pipe in command/status registers 276, while status messages are read from a status pipe in command/status registers 276. UAS mode can have a higher throughput than BOT mode, since commands and status are not blocking data in the data pipes.

Data hub 274 and command/status registers 276 connect to multiple USB controllers 280. Each USB controller 280 is able to control multiple SSD 282. Redundant Array of Individual Disks (RAID) functionality can be provided by having multiple SSD 282 per USB controller 280. USB controllers 280 could be replaced by SATA, USB 2.0, or SAS controllers.

Figure 7:
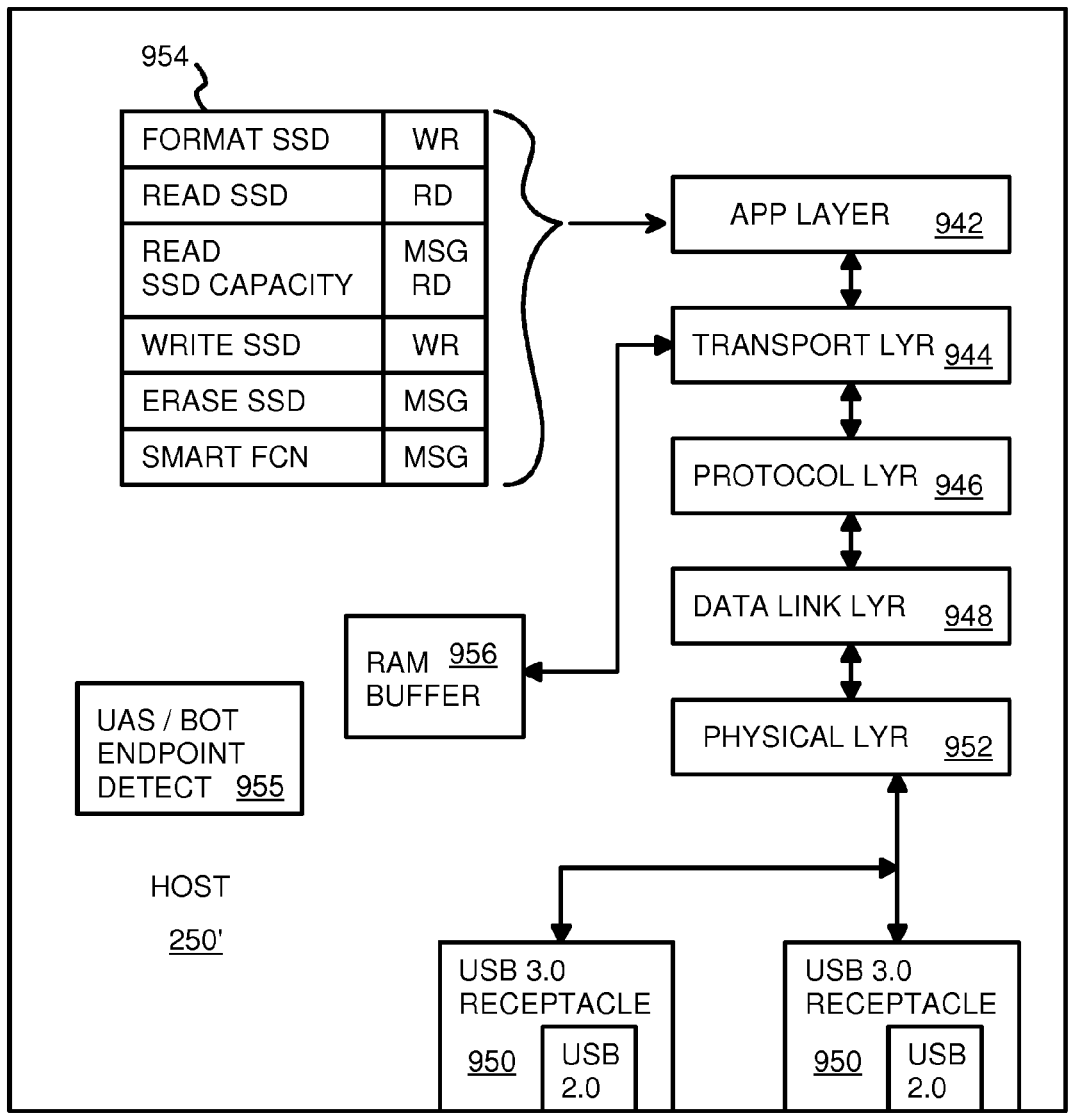
FIG. 7 shows a host that supports UAS and BOT modes for both USB 3.0 and USB 2.0 devices.

FIG. 7 shows a host that supports UAS and BOT modes for both USB 3.0 and USB 2.0 devices. Application layer 942 can execute applications that request various SSD operations 954.

SSD operations can include formatting and writing the flash memory (WR commands), reading the flash data (RD command), reading the capacity of the SSD (RD MSG command), and erasing the SSD or performing some other smart function (MSG commands). SSD operations 954 can be UAS commands These UAS commands are loaded into a data payload and any data is stored in RAM buffer 956 by transport layer 944. The data may be divided into USB packets and a protocol header and a CRC checksum added by protocol layer 946.

Data link layer 948 may further divide the data read payload from RAM buffer 956 and add sequence numbers and another checksum. Physical layer 952 adds framing and sends the frames for physical transmission from host 250' over one of USB 3.0/2.0 receptacles 950.

Figure 8:
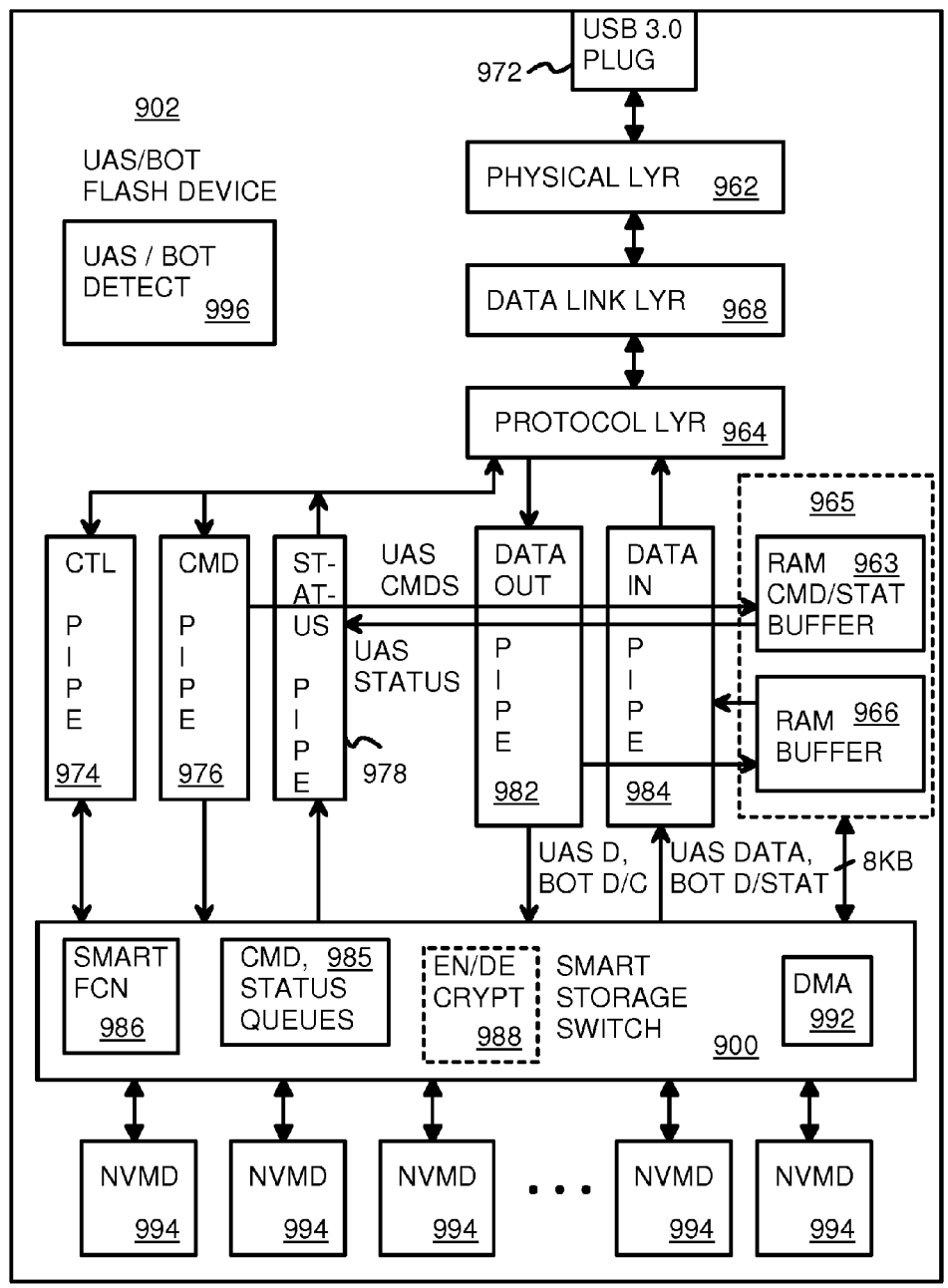
FIG. 8 shows a multi-pipe peripheral supporting both UAS and BOT modes.

FIG. 8 shows a multi-pipe peripheral supporting both UAS and BOT modes. A host connected to UAS/BOT flash device 902 by USB plug 972 sends data and commands using UAS or BOT modes. Framing is added and removed by physical layer 962, while packets are arranged by sequence number and checksums and data verified by data link layer 968. Protocol layer 964 removes protocol headers and checksums and detects commands and data or UAS protocols in the payloads.

Commands are loaded into command queue (CQ) 985. Commands can be re-ordered to increase the throughput and access of Non-Volatile Memory Devices (NVMDs) 994.

Data from the host are loaded into data-out pipe 982, while data read from NVMD 994 are read from data-in pipe 984 and formed into packets for transmission to the host by protocol layer 964. Commands are also loaded into data-out pipe 982 by protocol layer 964 and status read from data-in pipe 984 when UAS/BOT detector 996 detects that the host is operating in BOT mode.

When UAS/BOT detector 996 detects that the host is operating in UAS mode, commands from protocol layer 964 are loaded into command pipe 976, while status is read from status pipe 978. Commands and status are not sent through data pipes 982, 984 when UAS mode is detected, improving data pipe efficiency. UAS mode is detected by UAS/BOT detector 996 when the first byte (the identifier) of a new command from the host matches a particular value, such as 01 hex, and the first byte of the command descriptor block (CDB) within that command also matches an operation code for a UAS command.

Control information is sent through control pipe 974. Control information is used for both UAS and BOT modes. Control information is used for device enumeration during initialization and for setting device control parameters. Configurations are set using control pipe 974 and device capability information can be obtained using control pipe 974.

Pipes 974, 976, 978, 982, 984 can be physical registers with data that is either transferred directly with Smart Storage Switch 900, or with RAM buffers 963, 966 in RAM 965, which is then accessed by Smart Storage Switch 900.

Data packets for USB 2.0 are limited to 0.5 Kbytes, while USB 3.0 packets are limited to 1 KB. However, Smart Storage Switch 900 and NVMD 994 can operate more efficiently on larger data chunks. RAM buffer 966 combines smaller data packets from data-out pipe 982 into larger 8 KB packets that are sent to Smart Storage Switch 900. RAM buffer 966 also receives larger 8 KB data packets from Smart Storage Switch 900 and divides them into 1 KB or 0.5 KB packets that are then written into data-in pipe 984.

In UAS mode, commands are read from command pipe 976 and written into command/status buffer 963 before transfer to command/status queues 985 in Smart Storage Switch 900.

Status from command/status queues 985 in Smart Storage Switch 900 may be first written into command/status buffer 963 and then written into status pipe 978. In BOT mode, these commands and status use the data storage area in RAM buffer 966 and are routed through data pipes 982, 984.

Smart Storage Switch 900 uses direct-memory access (DMA) engine 992 to transfer larger 8 KB chunks of data to and from RAM buffer 966 and NVMD 994. Smart Storage Switch 900 includes mapping logic to re-map starting LBA's in commands to remapped LBA's that are sent to NVMD 994. Encryptor 988 optionally encrypts data before being written to NVMD 994 and decrypts data red from NVMD 994. Smart function processor 986 decodes smart commands and performs the decoded operation. Smart commands can include proprietary commands for NVMD 994. Self-Monitoring Analysis and Reporting Technology (SMART) commands can be used for diagnostic and self-test purposes.

Figure 9:
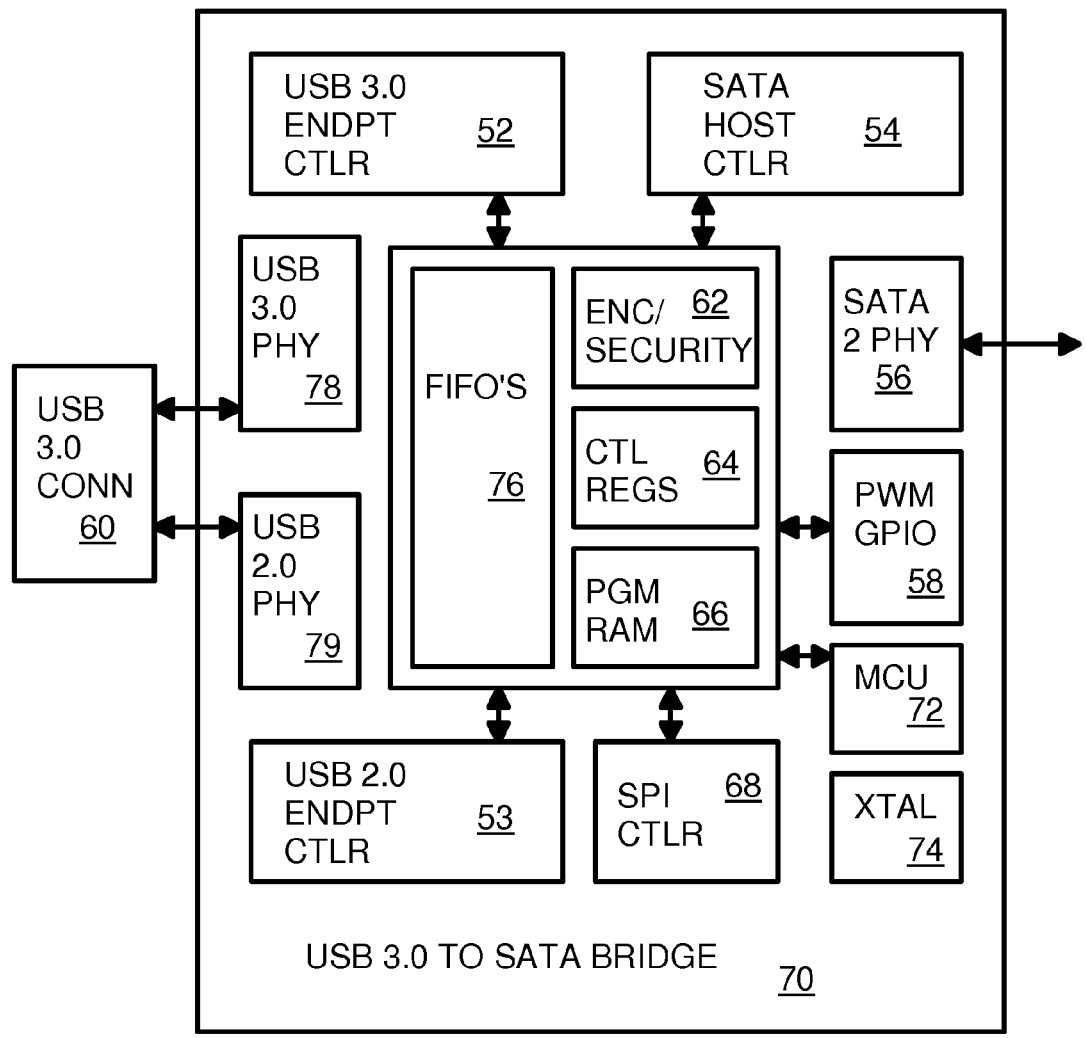
FIG. 9 shows a USB to SATA bridge.

FIG. 9 shows a USB to SATA bridge. USB connector 60 plugs into a USB host to receive USB packets that communicate with either USB 2.0 physical layer 79 or USB 3.0 physical layer 78, depending on the version of the protocol used by the host. Data is buffered by FIFO's 76 and processed by either USB 3.0 endpoint controller 52 or USB 2.0 endpoint controller 53.

USB-to-SATA bridge 70 converts SATA commands and data from the USB packets once the USB headers and checksums are stripped off by USB 3.0 endpoint controller 52 or USB 2.0 endpoint controller 53. SATA host controller 54 is used to control SATA 2 PHY 56 for interface to the downstream SATA 2 SSD. Master control unit (MCU) 72 controls operation of converting SATA commands that are detected in the data payloads in FIFOs 76. Program RAM 66 is the buffer and the running operating image for MCU 72. Security and encryption/decryption unit 62 can assist with AES, IEEE 1667, fingerprint, or other kinds of digital signature security functions, such as encryption and description and password verification or management. Control registers 64 can be loaded with USB and SATA control information for USB-to-SATA Bridge 70. Serial-Peripheral Interface (SPI) controller 68 provided a way for external debugging device to debug and update operating image of the USB-to-SATA Bridge 70. The general-purpose input-output (GPIO) 58, which has a programmable pulse width that is modulated for use in driving light-emitting diodes (LEDs) and other indicator lights or input signals for various debugging or detecting purposes. SATA-2 physical layer 56 performs the physical signaling needed for data transfers. Master control unit (MCU) 72 controls operation of the various components of USB-to-SATA bridge 70 using a clock from crystal 74.

Figure 10:
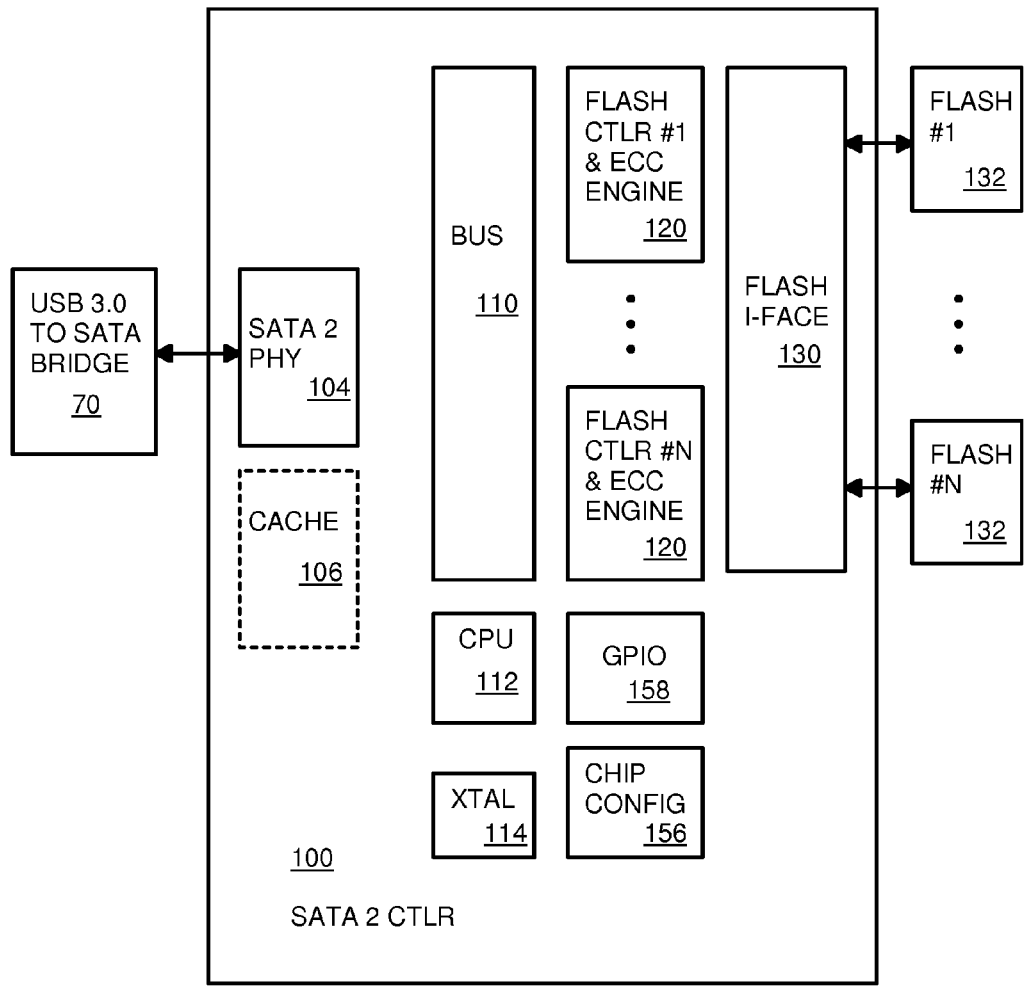
FIG. 10 shows a SATA-2 controller.

FIG. 10 shows a SATA-2 controller. SATA-2 controller 100 is connected to USB-to-SATA bridge 70 of FIG. 9 by SATA-2 physical layer 104. GPIO 158 has basic functions similar to GPIO 58 of FIG. 9 and provide I/O of CPU 112. Control information can change settings in chip configuration registers 156 through SATA commands. CPU 112 is clocked by crystal 114 and causes bus 110 to transfer data from SATA-2 physical layer 104 to multiple instances of flash controller and ECC engines 120. Flash memory 132 are controlled by flash controller and ECC engines 120 through flash interface 130. Cache 106 is optional storage for buffering data to and from bus 110.

Figure 11:
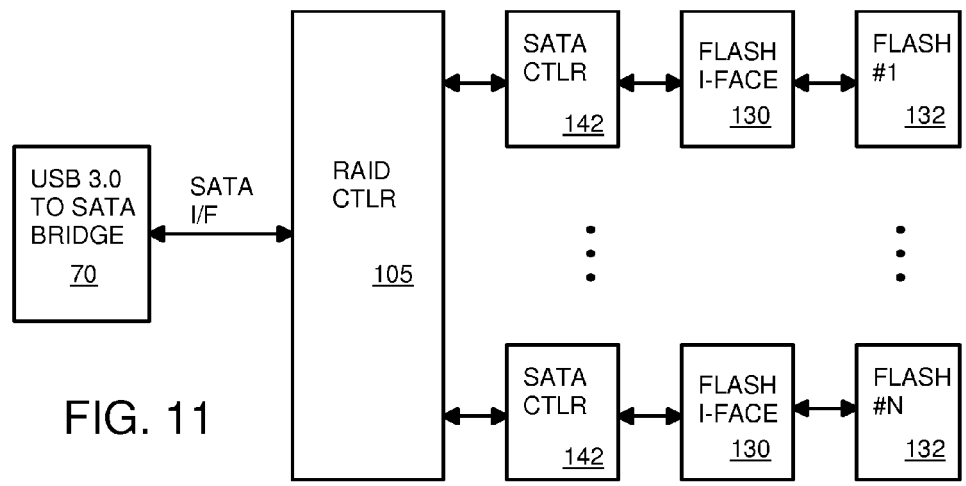
FIG. 11 shows a RAID SATA system.

FIG. 11 shows a RAID SATA system. USB-to-SATA bridge 70 of FIG. 9 connects over a SATA interface to RAID controller 105. RAID controller 105 distributes data into segments and stores data items on each of the physical devices of flash memory 132. Each flash memory 132 is accessed by a channel of SATA controller 142 and flash interface 130. According to a RAID setup, some of the channels may be used for redundancy purposes.

Figure 12:
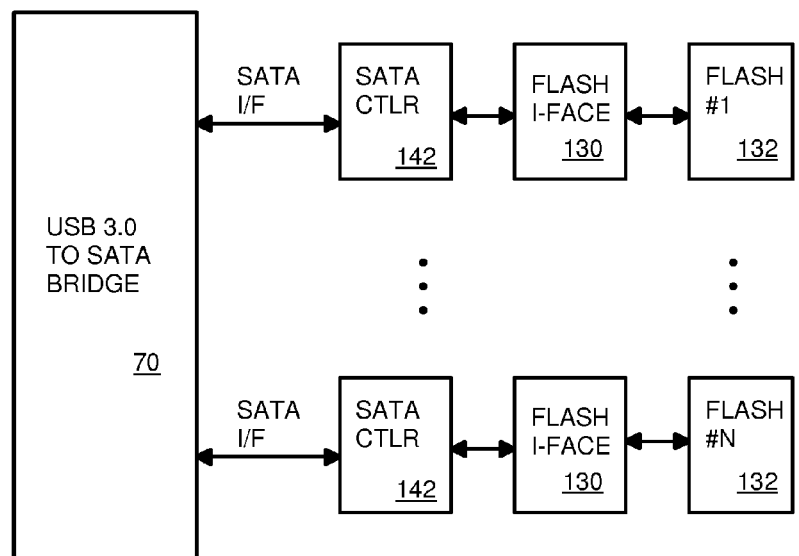
FIG. 12 shows a USB-to-SATA bridge to multiple SATA channels.

FIG. 12 shows a USB-to-SATA bridge to multiple SATA channels. USB-to-SATA bridge 70 of FIG. 9 connects over multiple SATA interfaces to multiple channels. Each channel has SATA controller 142 and flash interface 130 to flash memory 132.

Figure 13:
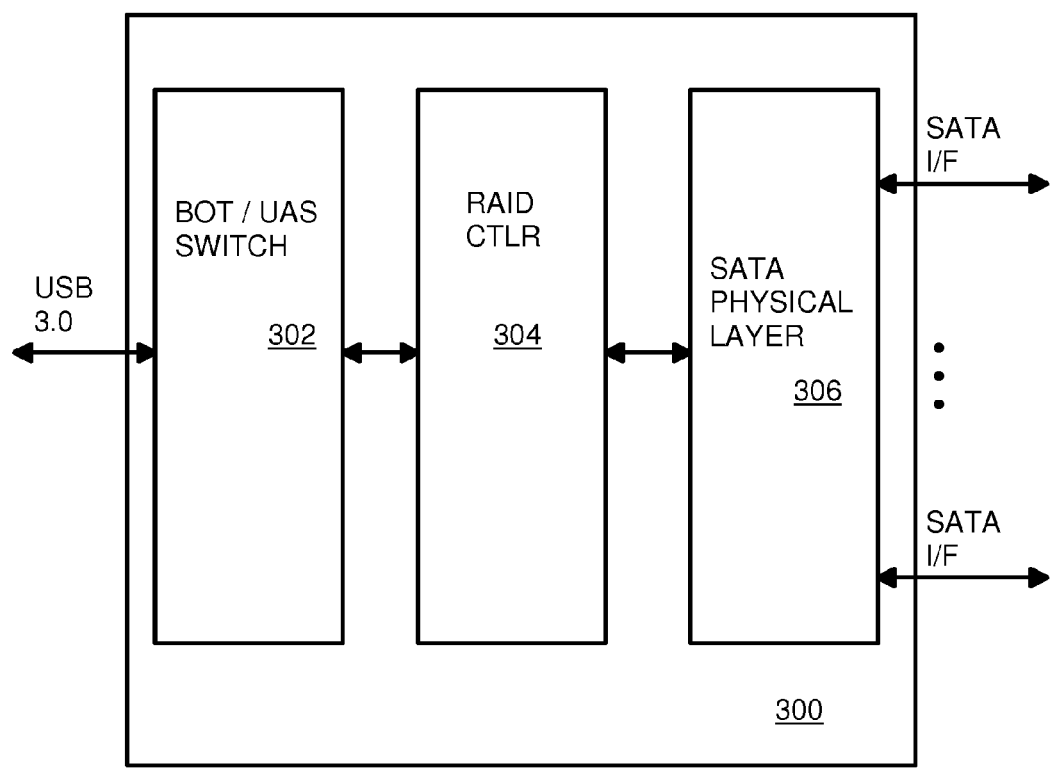
FIG. 13 highlights an integrated bridge with a UAS/BOT switch using RAID to control multiple SATA channels for a USB host.

FIG. 13 highlights an integrated bridge with a UAS/BOT switch using RAID to control multiple SATA channels for a USB host. RAID bridge 300 has BOT/UAS switch 302, RAID controller 304, and SATA physical layer 306.

BOT/UAS switch 302 receives USB packets from a host and detects UAS mode or BOT mode. RAID controller 304 duplicates data for redundant storage, while SATA physical layer 306 connects to multiple SATA interfaces to multiple SATA flash devices.

Figure 14:
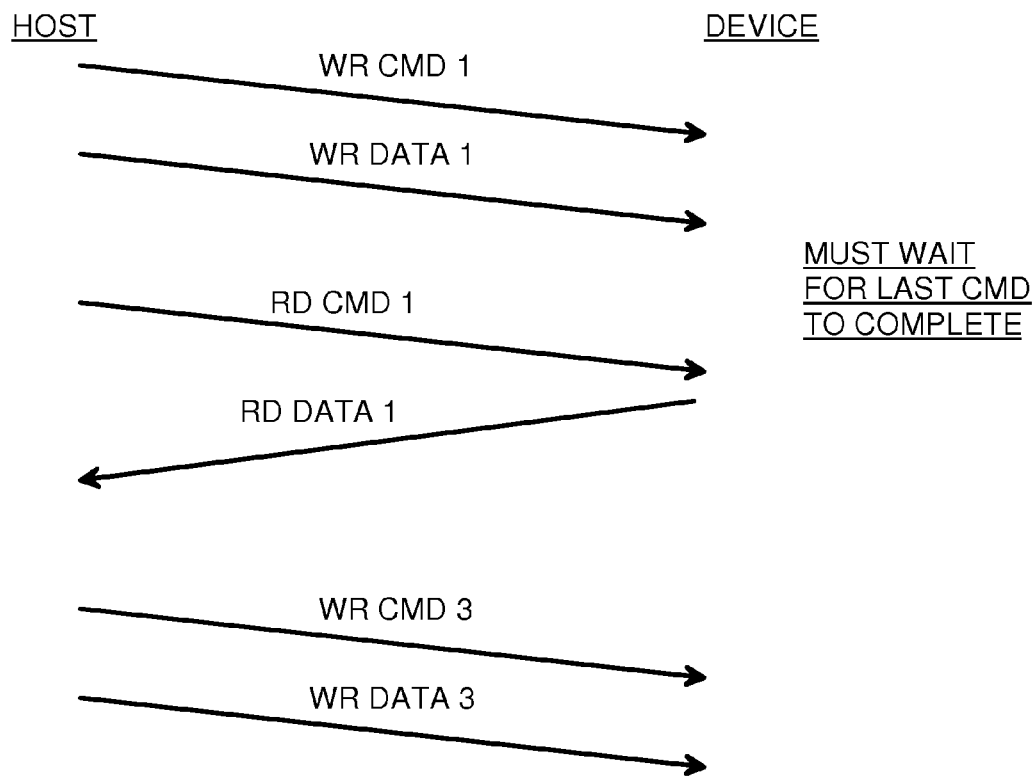
FIG. 14 highlights message transfers for a write using BOT mode.

FIG. 14 highlights message transfers for a write using BOT mode. For a write, the host sends a write command to the device through the data-out pipe 982 and then sends the write data to the device through the data-out pipe. The device writes this data to an internal buffer memory and then sends a message back to the host through data-in pipe 984 indicting completion of the write command. The host can then send the next command, a read through the data-out pipe. The device locates the requested data and sends the read data back through the data-in pipe to the host along with a message indicating a successful completion of the read command.

The host can then send the next command, a write command, along with the write data. The device writes the data into an internal buffer, sends back a success message to the host, and later writes the data to flash memory.

When operating in BOT mode, the host must wait until the device sends a message indicating that the command was successfully completed before sending the next command. Thus commands are dispatched and processed serially. Waiting for the last command to complete causes the host USB bus to be idle at times, reducing throughput.

Figure 15:
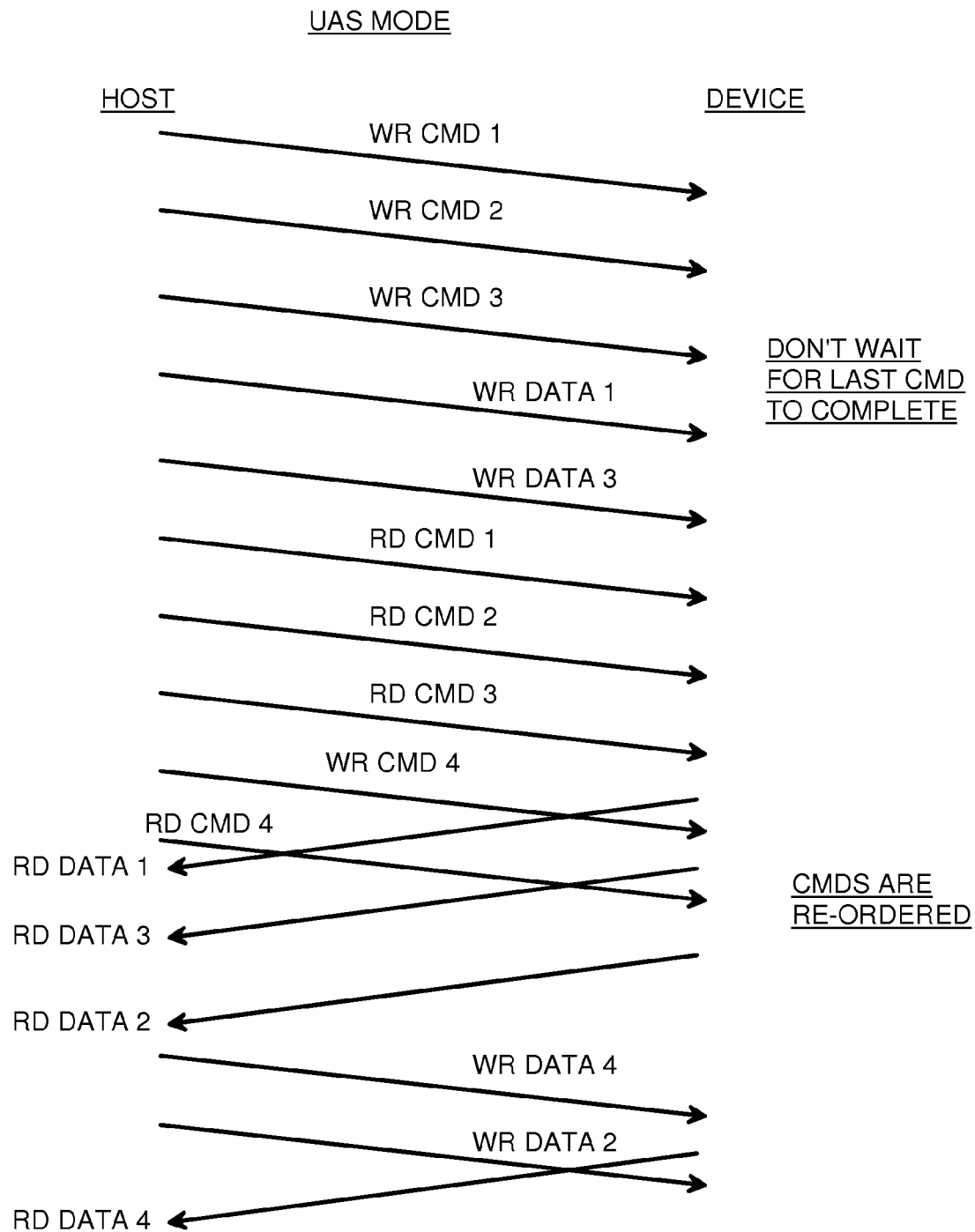
FIG. 15 highlights message transfers in UAS mode.

FIG. 15 highlights message transfers in UAS mode. USB 3.0 supports more complex transfer sequences that are used for UAS mode. The host can dispatch several commands without having to wait for the device to service the last command. The host-to-device USB bus is much more efficiently utilized since new commands can be transferred while waiting for the device to complete a command.

In this example, the host sends three write commands, WR CMD 1, WR CMD 2, WR CMD 3 through command pipe 976. These commands may contain the starting logical block address (LBA) of the data, the data transfer length, TAG, and other information. The data for the first and third of these write commands is sent by the host as WR DATA 1, WR DATA 3. WR DATA 2 is not sent until the end of this sequence of command, shown at the end of FIG. 15. The device may have the buffer ready for data 1 and 3 but not for data 2, or data 2 may be longer or have a lower priority and is thus delayed by the device. The device stores WR DATA 1 and WR DATA 3 in a buffer and late writes it to flash memory.

The host then issues three read commands, RD CMD 1, RD CMD 2, RD CMD 3, which each contain a starting LBA and a data length. The device begins reading the requested data, perhaps finding the data in a cache or perhaps having to read the data from slower flash memory, so the RD DATA sequences may not follow the RD CMD sequence.

The host sends further commands WR CMD 4 and RD CMD 4. The device finds RD DATA 1, 2, and 3 and sends these back to the host, although in a different order since RD DATA 3 is ready within the device before RD DATA 2.

Perhaps read data 3 was in a cache but RD DATA 2 had to be read from flash memory or was from a bank of memory that was busy with another access.

The host then sends WR DATA 4 and finally WR DATA 2 when the device is ready to receive it. The device stores this read data in its buffer and later writes it to flash memory. Finally, RD DATA 4 is read within the device and is transferred to the host over the USB bus.

When operating in UAS mode, the host can send a new command before the last command has been processed by the device, or even before the write data has been sent. The host has great flexibility in ordering commands and write data.

The device also has flexibility in processing commands. Once write data has been stored in a buffer, it can be sent to flash memory at any later time, and in any order, subject to any data dependencies, such as the same LBA being written twice. The device can send back read data in any order, not just in the order the commands were received.

The USB bus between the host and device is efficiently used, since additional commands are transferred while the device is still processing earlier commands. A much higher throughput is possible.

Figure 16A:
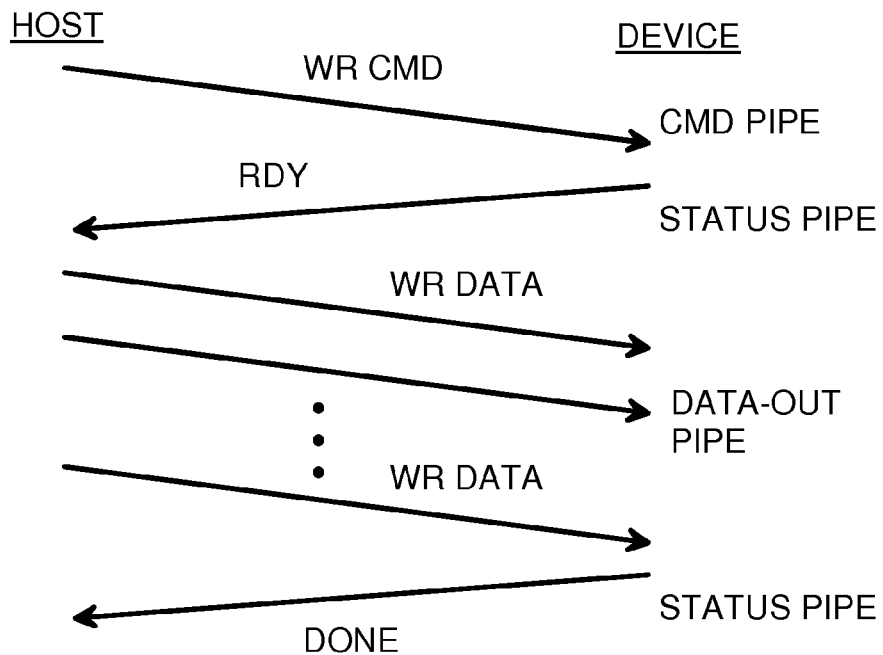
FIGS. 16A-B highlight write and read transfers in UAS mode.
Figure 16B:
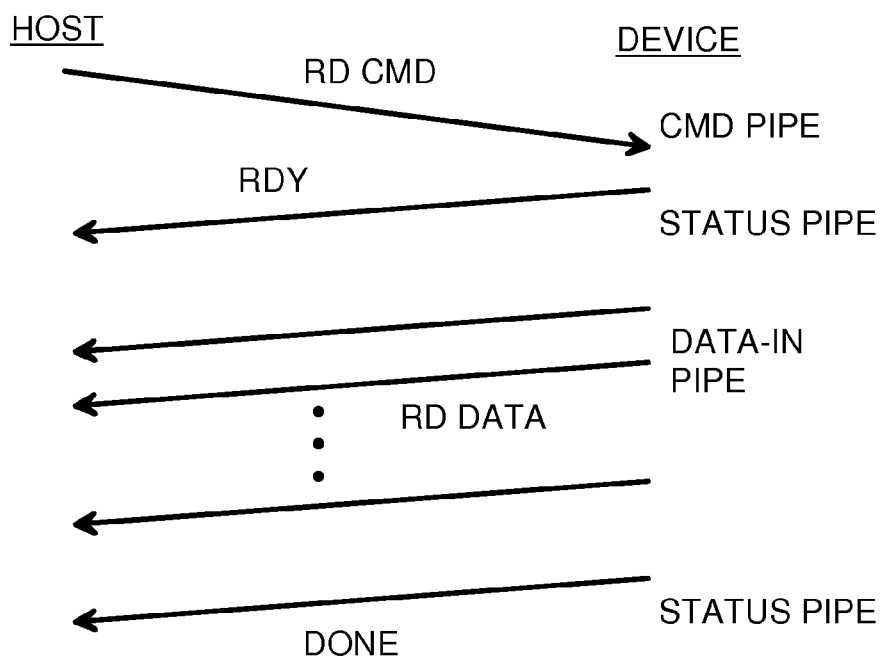

FIGS. 16A-B highlight write and read transfers in UAS mode. Each of the transfers shown in FIG. 15 can require several messages to be exchanged as shown in FIGS. 16A-B. In FIG. 16A, a single write command using UAS mode is shown.

The host sends a write command message to the host that contains the starting LBA and data length. UAS mode is detected since UAS/BOT detector 996 (FIG. 8) detects that the first byte (the identifier) of the command from the host matches a particular value, such as 01 hex, and the first byte of the command descriptor block (CDB) within that command also matches an operation code for a UAS command. Since UAS mode is detected, this write command is received in command pipe 976 (FIG. 8)) and stored in command/status buffer 963 on the device.

The device generates a write ready (RDY) message that is placed in status pipe 978 and sent back to the host. The host can then send the write data through data-out pipe 982. The write data is long, so the host divides the write data into several packets that are sent to the device and stored in RAM buffer 966. Once the number of bytes in the received write packets matches the data transfer length from the write command, the device generates a DONE status message that is placed in status pipe 978 and sent back to the host. The host write command is completed.

In FIG. 16B, a single read command using UAS mode is shown. The host sends a read command message to the host that contains the starting LBA and data length. UAS mode is detected since UAS/BOT detector 996 (FIG. 8) detects that the first byte (the identifier) of the command from the host matches a particular value, such as 01 hex, and the first byte of the command descriptor block (CDB) within that command also matches an operation code for a UAS command. Since UAS mode is detected, this read command is received in command pipe 976 (FIG. 8) and stored in RAM CMD/STAT buffer 963 on the device.

The device finds the read data and transfers it to an internal buffer and then to RAM buffer 966. The device generates a read ready (RDY) message that is placed in status pipe 978 and sent back to the host. The host can then expect the read data, although the host does not have to delay any other commands. The read data is long, so the device divides the read data into several packets. The device then sends the read data packets from data-in pipe 984 to the host over the USB bus.

Once the number of bytes in the read packets sent matches the data transfer length from the read command, the device generates a DONE status message that is placed in status pipe 978 and sent back to the host. The host read command is completed.

The various messages passed in FIGS. 16A-B can be intermeshed with messages for other commands, as shown in FIG. 15. The messages for FIG. 16B could be interspersed between the messages shown in FIG. 16A, for example, so that the read command of FIG. 16B starts before the write data of FIG. 16A is sent. Since the transmitting and receiving paths are fully independent, both directions of data can be transferred at the same time.

The beginning portion of each command can be sent out to the device if it meets the requirements of the command queue limit. The data phase of each command cannot be mixed with each other. Once the device responses to the read/write command, the Data-In Pipe and Data-Out Pipe are used for data transfer for that command.

Figure 17:
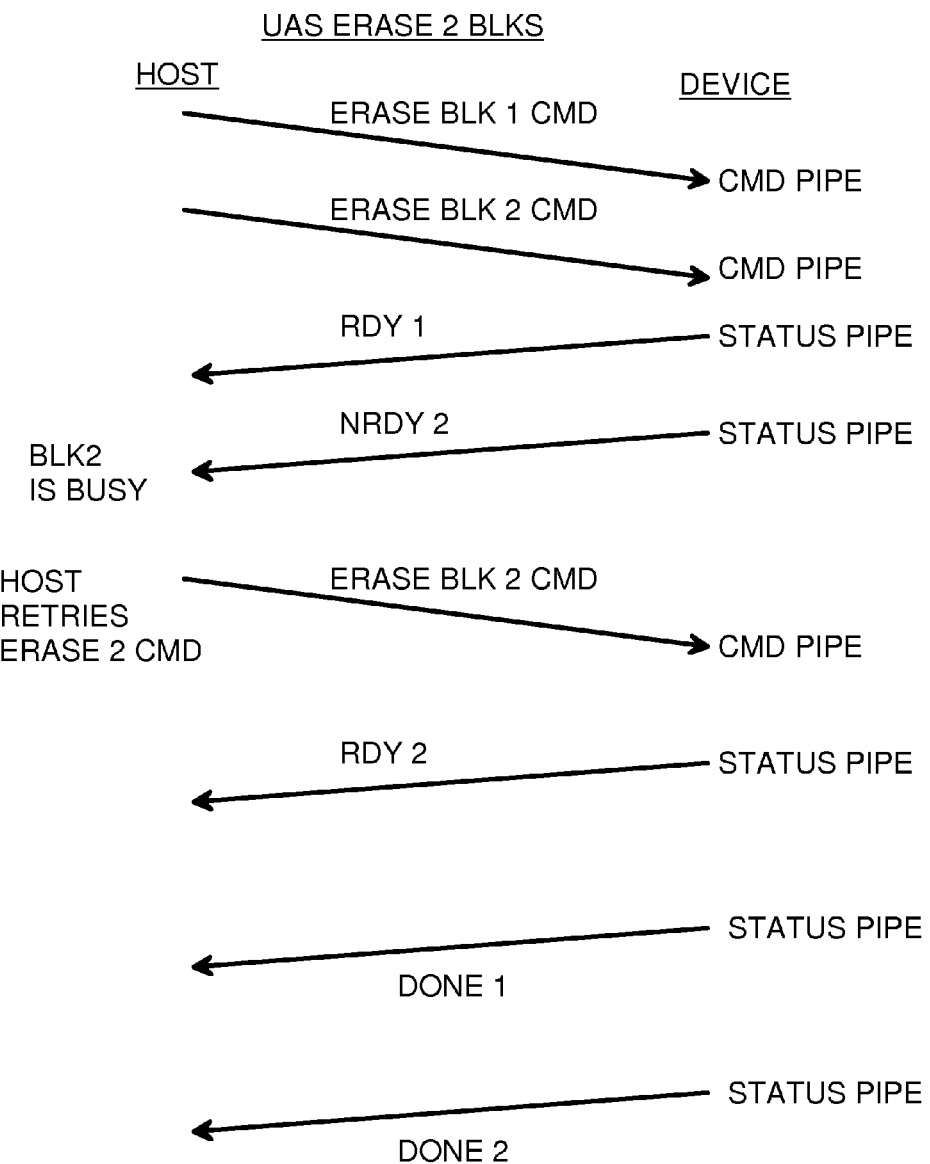
FIG. 17 highlights messages for erase commands.

FIG. 17 highlights messages for erase commands. The host is operating in UAS mode, as detected by UAS/BOT detector 996 (FIG. 8). The host sends a message with an ERASE BLK 1 command to the device, followed by another message with an ERASE BLK 2 command. The device stores these commands in command pipe 976 and determines that block 1 is not being used and is thus ready, while block 2 is busy with another access and is not ready. The device generates a RDY message for the ERASE BLK 1 command and a not ready (NRDY) for the ERASE BLK 2 command, and both messages are loaded through status pipe 978 and sent to the host. The device begins erasing block 1 of flash memory.

After some time, the host retries the ERASE BLK 2 command by sending another command message to the device. This command is also placed in command pipe 976. The device now finds that block 2 is no longer busy and generates a RDY message for the ERASE BLK 2 command that is loaded into status pipe 978 and sent to the host. The device begins erasing block 2 of flash memory.

The erase operation is a length operation. Eventually, block 1 is erased and the device generates a DONE message for the ERASE BLK 1 command that is loaded into status pipe 978 and sent to the host. Later, block 2 is also erased and the device generates a DONE message for the ERASE BLK 2 command that is loaded into status pipe 978 and sent to the host. Other commands could be processed during this time, such as reads and writes of other blocks or of cached data.

Figure 18:
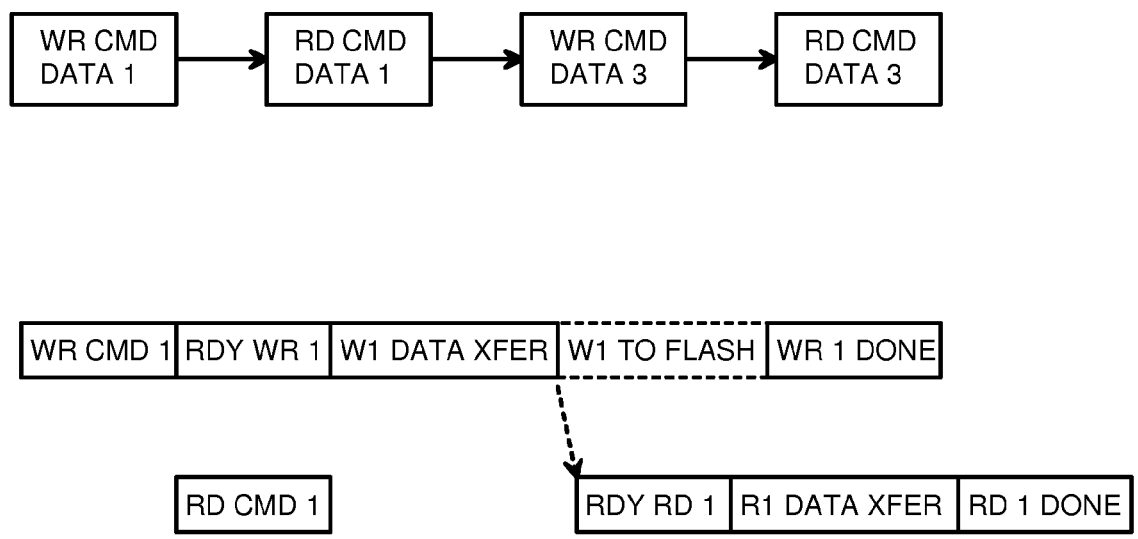
FIG. 18 highlights a data dependency among two commands.

FIG. 18 highlights a data dependency among two commands with the same address and data. A sequence of commands from the host includes WR CMD DATA 1 followed by RD CMD DATA 1. Both are accessing the same data (DATA 1), such as for a read-back after the host writes data to verify the data write.

The sequences of messages for the write command begins with WR CMD 1 from the host, which is responded to by the device with RDY WR 1. The host then sends the data in one or more messages as W1 DATA XFER. The device stores this data in a buffer and later writes the data to flash. Once the data is stored in the buffer, the device generates a WR 1 DONE message to the host.

The sequences of messages for the read command begins with RD CMD 1 from the host, which is responded to by the device with RDY RD 1. The host then waits for the device to send the data in one or more messages as R1 DATA XFER. However, since the read data overlaps the write data, as detected by the starting LBA's and data lengths of the write and read commands, the device waits to respond to the read command until all the data has been stored in the internal buffer from the write command. Once W1 DATA XFER is completed, the device generates one or more packets with the read DATA 1 and sends them to the host as R1 DATA XFER. The host stores this read data. Once the data is transferred to the host, the device generates a RD 1 DONE message to the host.

Figure 19A:
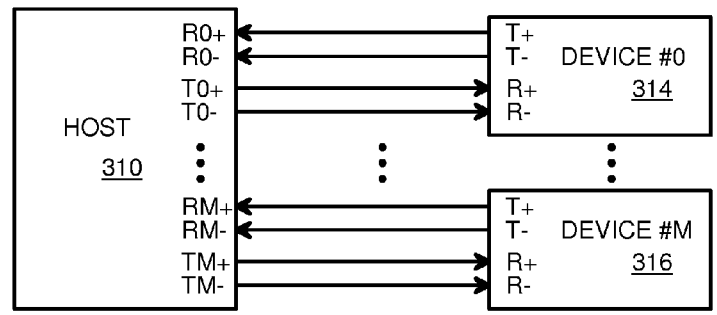
FIGS. 19A-B show multiple lanes in a USB connection between the host and devices.
Figure 19B:
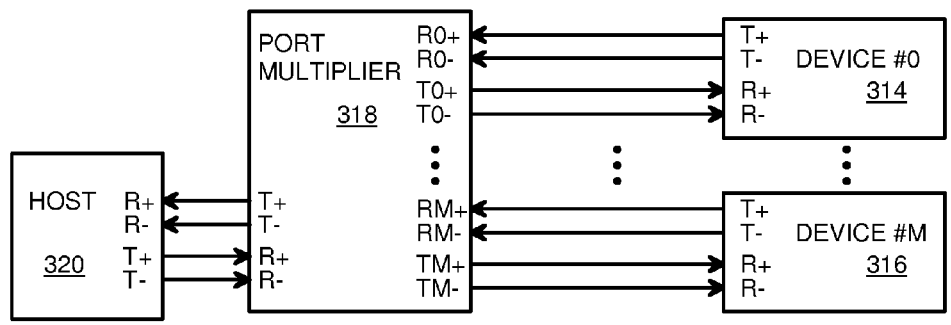

FIGS. 19A-B show multiple lanes in a USB connection between the host and devices. In FIG. 19A, host 310 connects to multiple devices 314, 316. Each connection is bi-directional, having one pair for transmitting from the host to the device, and another pair for transmitting from the device to the host. Packets are sent as a sequence of differential data bits from pins T0+, T0− on the host to pins R+, R− on the device. Packets are returned as a sequence of differential data bits from pins T+, T− on the device to pins R0+, R0− on the host for the connection to device #0, device 314.

For the connection to device #M, device 316, packets are sent as a sequence of differential data bits from pins TM+, TM− on the host to pins R+, R− on the device. Packets are returned as a sequence of differential data bits from pins T+, T− on the device to pins RM+, RM− on the host. The host can separately manage each connection and transfer simultaneously to different devices.

In FIG. 19B, host 320 has only 1 connection, and this connection is made to port multiplier 318. Host packets are sent as a sequence of differential data bits from pins T+, T− on the host to pins R+, R− on port multiplier 318. Packets are returned as a sequence of differential data bits from pins T+, T− on port multiplier 318 to pins R+, R− on host 320.

Port multiplier 318 connects to multiple devices 314, 316. Each connection is bi-directional, having one pair for transmitting from port multiplier 318 to the device, and another pair for transmitting from the device to port multiplier 318 and on to the host. Packets are sent as a sequence of differential data bits from pins T0+, T0− on port multiplier 318 to pins R+, R− on device 314. Packets are returned as a sequence of differential data bits from pins T+, T− on device 314 to pins R0+, R0− on port multiplier 318 for the connection to device #0, device 314.

For the connection to device #M, device 316, packets are sent as a sequence of differential data bits from pins TM+, TM− on port multiplier 318 to pins R+, R− on device 316. Packets are returned as a sequence of differential data bits from pins T+, T− on the device to pins RM+, RM− on port multiplier 318. Port multiplier 318 can separately manage each connection and transfer simultaneously to different devices, and pass packets to and from host 320.

Figure 20A:
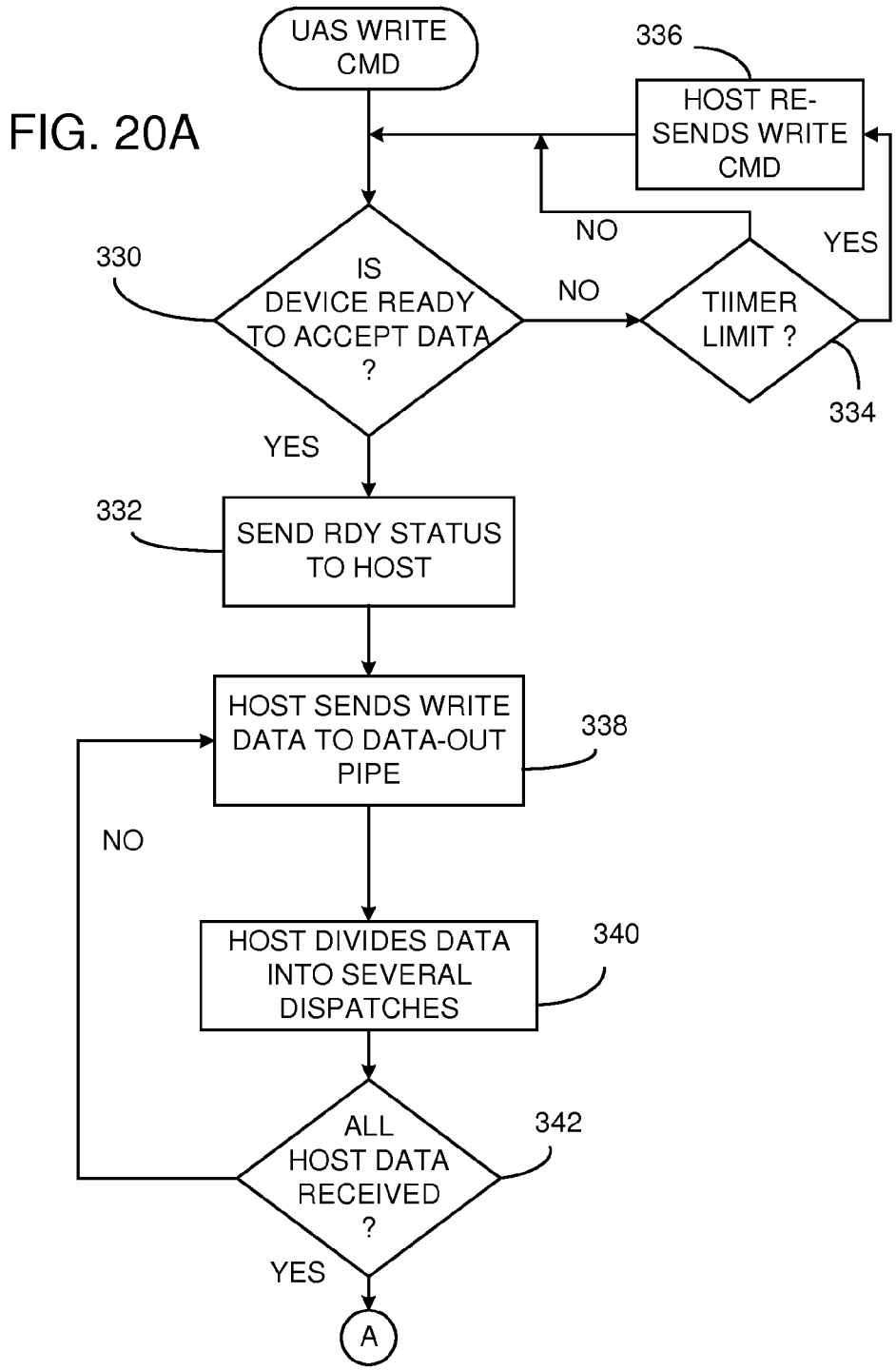
FIGS. 20A-B show a flowchart of a UAS write command.
Figure 20B:
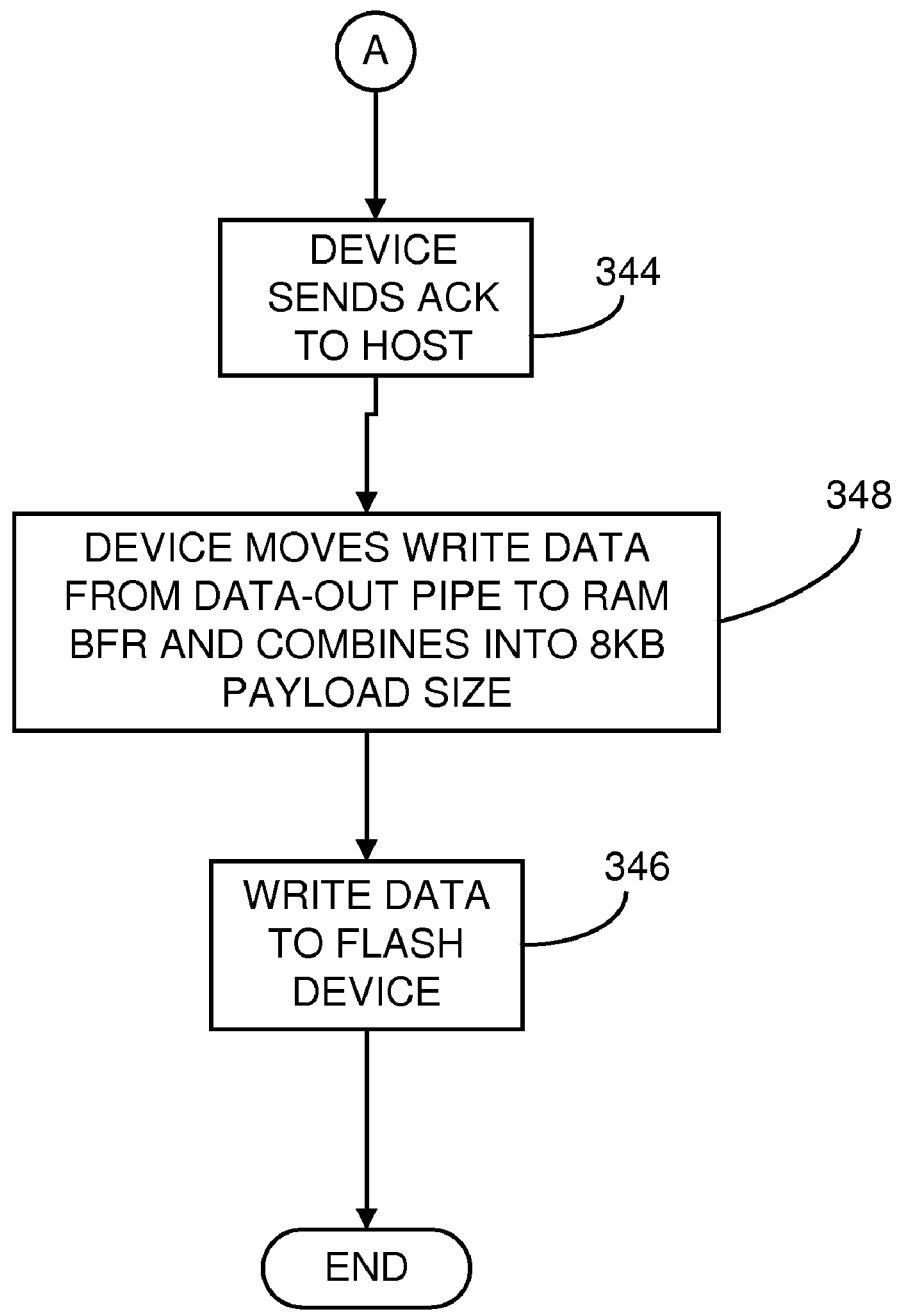

FIGS. 20A-B show a flowchart of a UAS write command. In FIG. 20A, the host sends a write command and UAS mode is detected by the device. If the device is ready to accept data, and has space in its data buffer, step 330, then the device sends a RDY status message back to the host, step 332. If the device is not ready, step 330, then the device waits until the device is ready. After the host's timer limit is reached, step 334, then the host assumes that the device was not ready, or the command was lost, and the host re-sends the write command, step 336.

When the host receives the RDY message from the device, step 332, the host sends the write data through the data-out pipe in the device, step 338. The data may be divided into several dispatches, step 340, for longer data transfers. Once all the data has been received by the device, step 342, the process continues on FIG. 20B. The data received from the data-out pipe are moved to RAM buffer 966 (FIG. 8).

The device sends an acknowledgement ACK message to the host, step 344, to indicate successful receipt of all data. The device uses the data in RAM buffer 966 (FIG. 8) and combines the data from every eight 1 KB USB packets into one 8 KB flash page, step 348. The 8 KB data payloads are more efficiently moved and stored by the device since there is less overhead than with 8 or more separate packets. The device then writes the data to the flash memory, step 346.

Figure 21A:
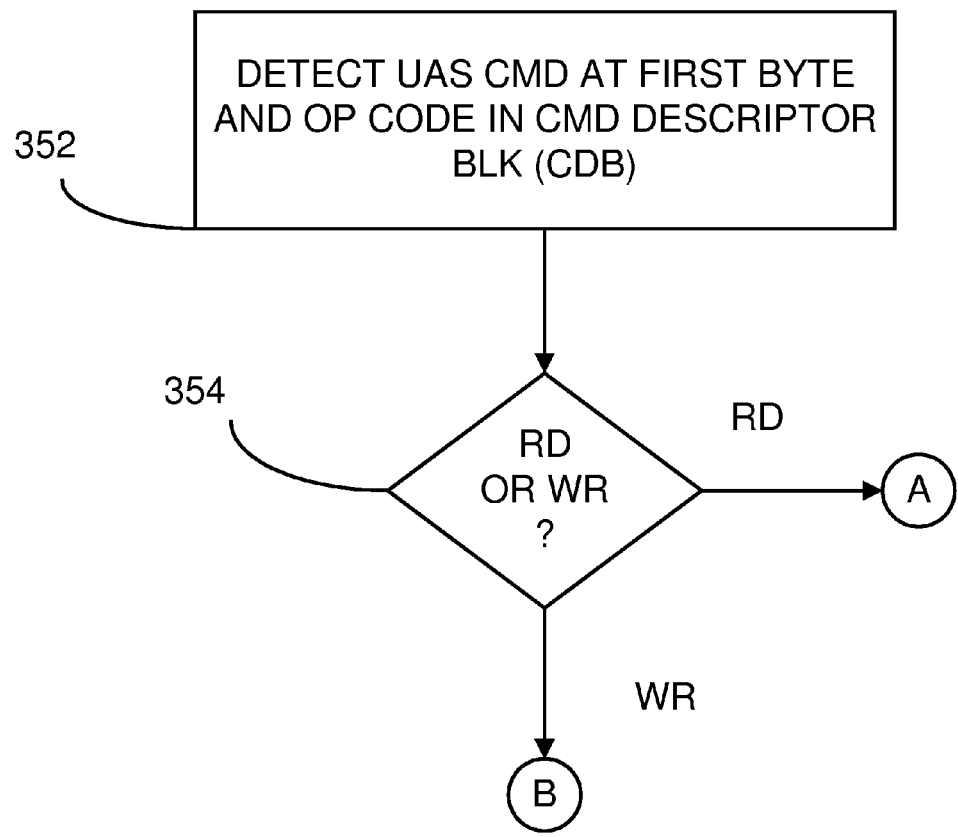
FIGS. 21A-C show a flowchart of the device processing a UAS mode command.
Figure 21B:
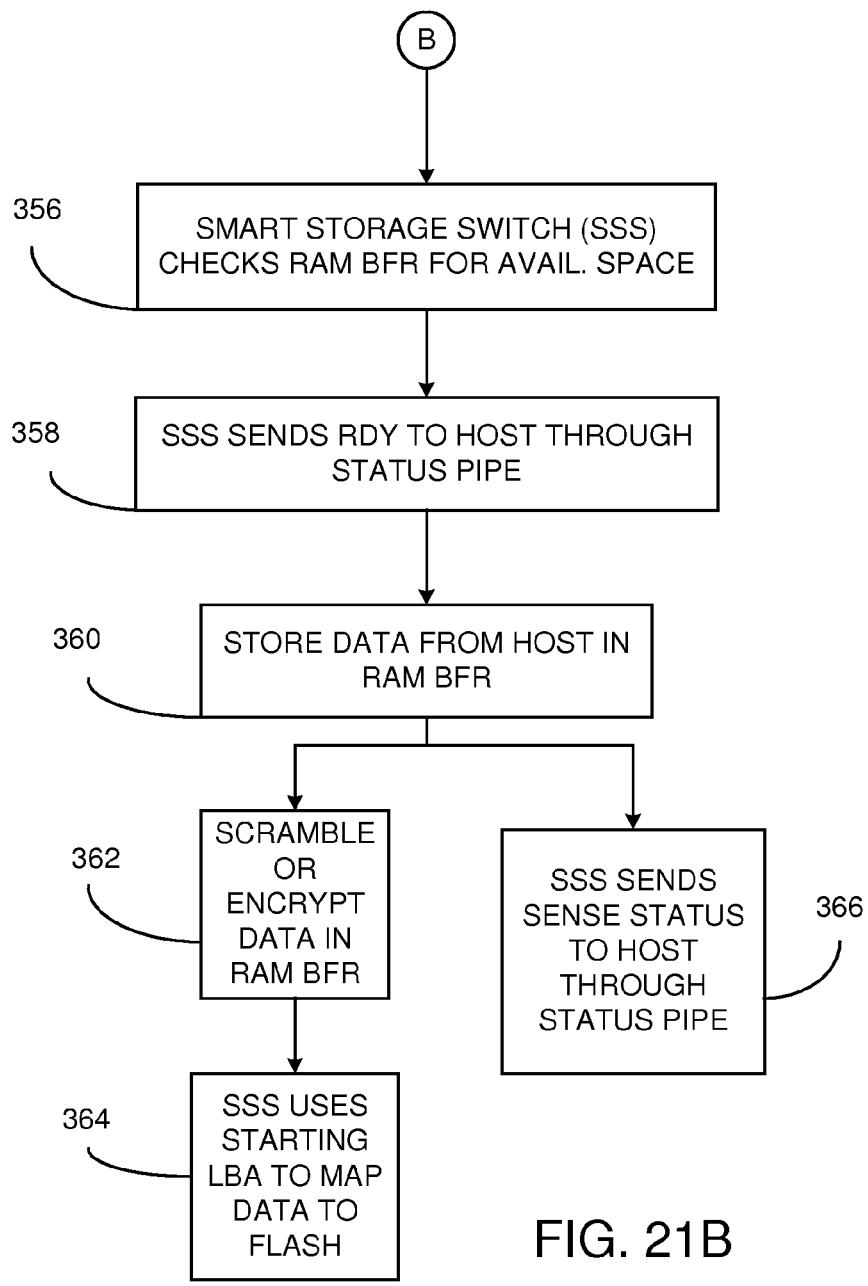
Figure 21C:
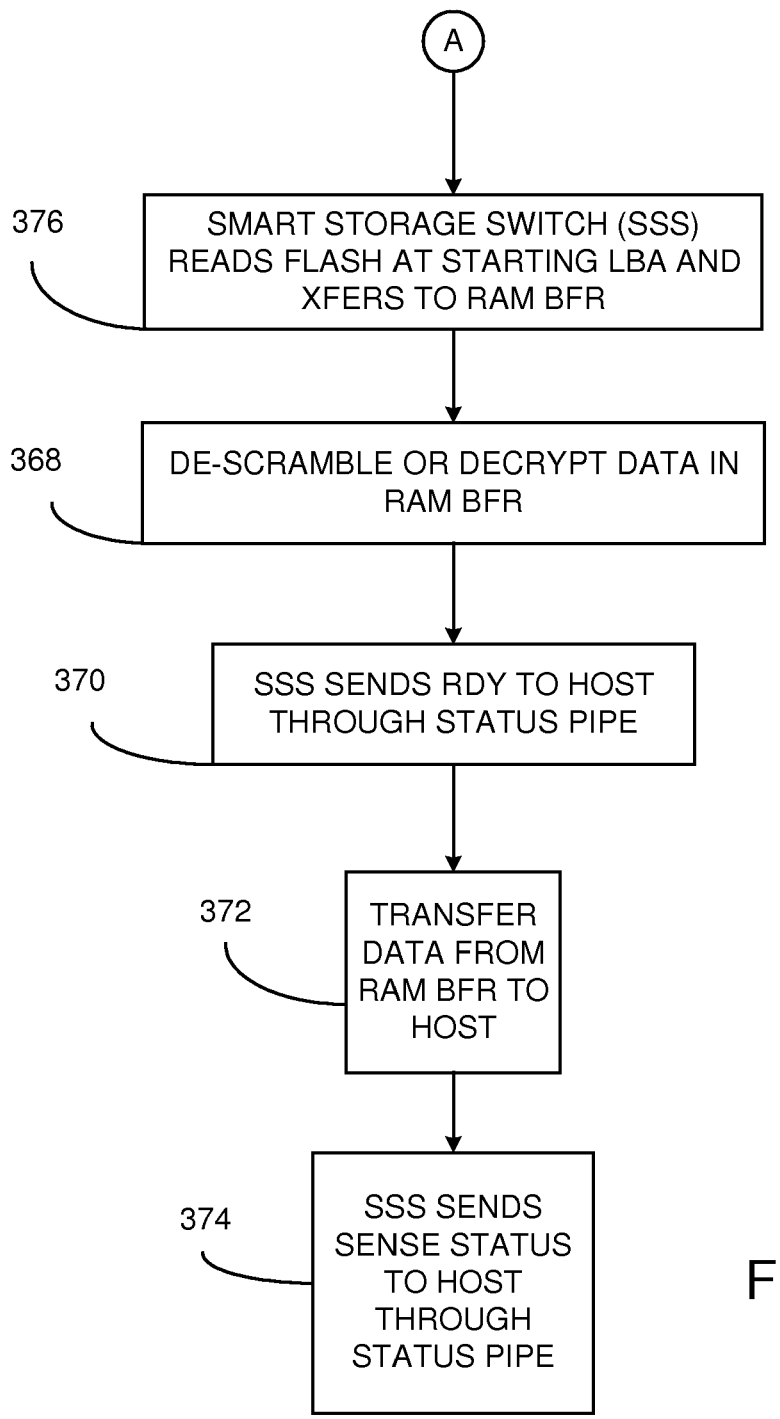

FIGS. 21A-C show a flowchart of the device processing a UAS mode command. In FIG. 21A, UAS/BOT detector 996 (FIG. 8) detects UAS mode in a message by identifying that the command is received from command Pipe 976 and matching the first byte in the command to a value used by UAS command, and by matching the first byte in the command descriptor block (CDB) to an operation code used by UAS, step 352. BOT mode commands are not processed by the flow of FIG. 21.

Read commands are processed as shown in FIG. 21C, while write commands are processed as shown in FIG. 21B, step 354. The SCSI command at the Command Descriptor Block (CDB) from the host can be decoded to indicate read or write.

In FIG. 21B, a write command is processed by the device. The Smart Storage Switch checks for available space in RAM buffer 966 to accept new host data, step 356. The write command indicates a data length, and RAM buffer 966 must have at least the data length of empty space available (8 KB of flash page). When sufficient space is available, the device sends a RDY message to the host through status pipe 978, step 358. In BOT mode, the RDY message is loaded into data-in pipe 984. The host write data is sent through data-out pipe 982, and then moved into RAM buffer 966, step 360.

The Smart Storage Switch in the device sends a SENSE status message to the host through status pipe 978, step 366, for UAS mode, or through data-in pipe 984 for BOT mode. The data in RAM buffer 966 is scrambled or encrypted if needed, step 362, and the Smart Storage Switch uses the starting LBA from the command to map the write data to a location in flash memory, step 364. The write data can be written to flash memory at a later time, or cached in RAM buffer 966 or in another cache or buffer.

In FIG. 21C, a read command is processed by the device. The Smart Storage Switch uses the starting LBA from the read command to locate the data using maps or other directories, step 376. The located data is read from flash or cache and moved into RAM buffer 966. The data in RAM buffer 966 is unscrambled or decrypted if needed, step 368. The Smart Storage Switch generates and sends a RDY message to the host through status pipe 978, step 370. In BOT mode, the RDY message is loaded into data-in pipe 984.

The Smart Storage Switch transfers the read data from RAM buffer 966 to data-in pipe 984 and then to the host, step 372. The Smart Storage Switch may divide an 8 KB flash page data in RAM buffer 966 into 1 KB packets in data-in pipe 984 for transmission over USB to the host.

The Smart Storage Switch in the device sends a SENSE status message to the host through status pipe 978, step 374, for UAS mode, or through data-in pipe 984 for BOT mode.

Figure 22:
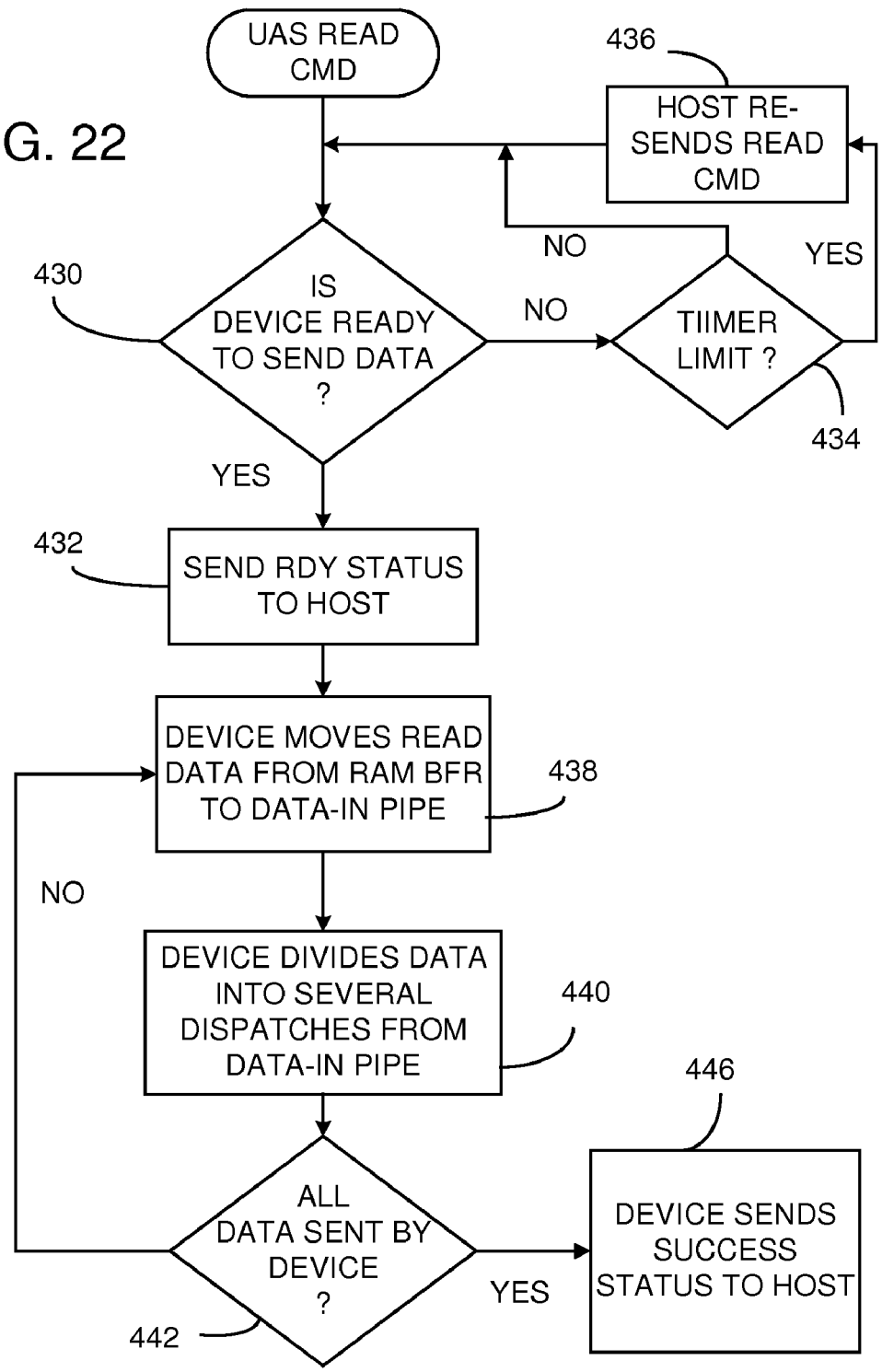
FIG. 22 is a flowchart of the device processing a UAS read command.

FIG. 22 is a flowchart of the device processing a UAS read command. The host sends a read command and UAS mode is detected by the device. If the device is ready to process the read command, step 430. The device reads the data from flash memory or from a cache or other buffer and moves the data to RAM buffer 966, then the device sends a RDY status message back to the host, step 342. If the device is not ready, step 430, then the device waits until the device is ready. After the host's timer limit is reached, step 434, then the host assumes that the device was not ready, or the command was lost, and the host re-sends the read command, step 436.

When the host receives the RDY message from the device, step 432, the device moves the data from RAM buffer 966 (FIG. 8) into data-in pipe 984, step 438. The device may divide an 8 KB data payload into several smaller 1 KB USB packets loaded into data-in pipe 984, step 440. The device then sends the data through data-in pipe 984 to the host. Once all read data is sent by the device, step 442, the device sends a SUCCESS message to the host, step 446, to indicate successful transmission of the data.

Figures 23A, 23B:
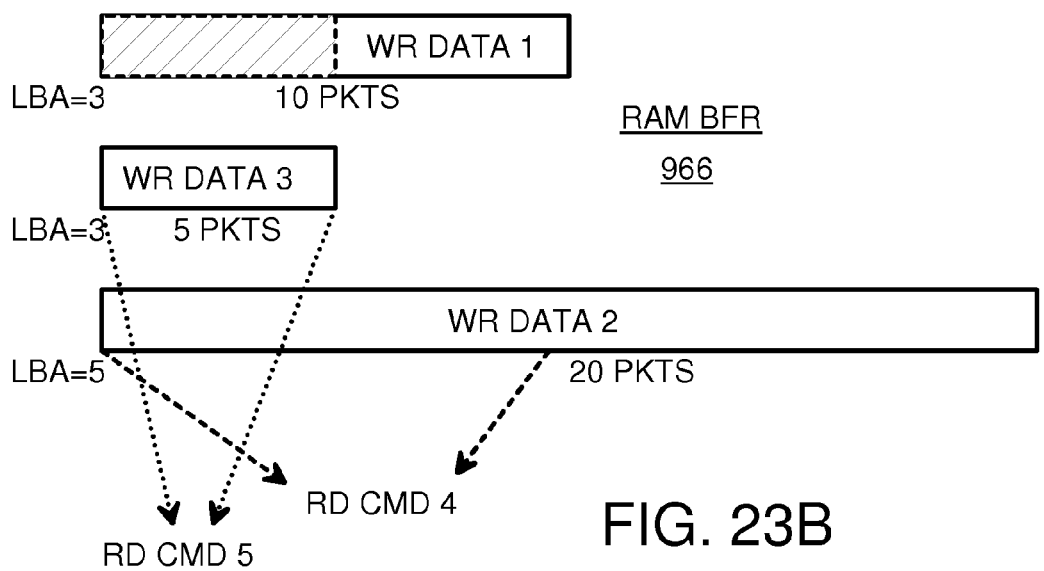
FIGS. 23A-C illustrate a sequence of commands with data dependencies.
Figure 23C:
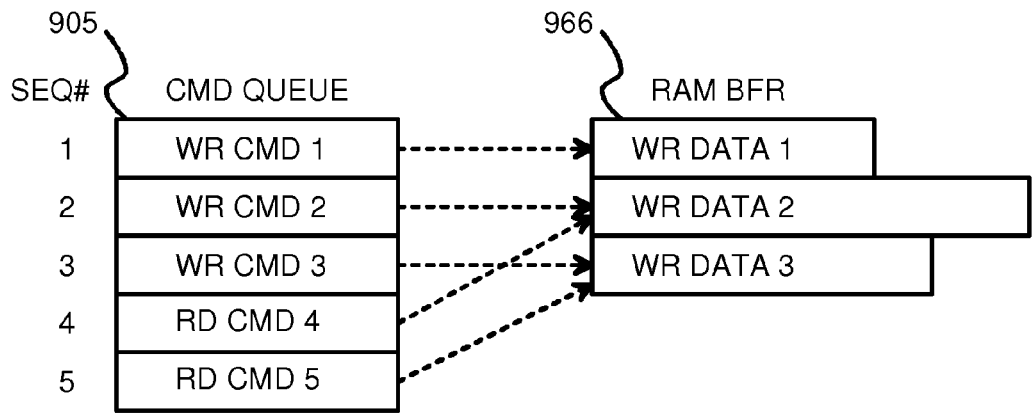

FIGS. 23A-C illustrate a sequence of commands with data dependencies. In FIG. 23A, the host sends a sequence of write and read commands to the device using UAS mode. The command type, starting LBA, and data length for each command are stored in a command queue in to command/status queues 985 (FIG. 8). These commands may be reordered for processing by the Smart Storage Switch.

FIG. 23B shows the data mapping of the commands in FIG. 23A. WR CMD 1 starts at LBA 3 and is 10 packets in length. WR CMD 2 starts at LBA 5 and is 20 packets in length. WR CMD 3 also starts at LBA 3 but is only 5 packets in length. The data for these 3 write commands is stored separately in RAM buffer 966 even though the data overlaps in the LBA address space.

RD CMD 4 reads the first 10 packets of WR DATA 2, starting at LBA 5. RD CMD 5 reads the first 5 packets of WR DATA 3, starting at LBA 3. The shaded data in WR DATA 1 is stale since WR DATA 3 is newer than WR DATA 1.

FIG. 23C shows mapping of data in the RAM buffer to commands in the command queue. WR DATA 1, 2, 3 for write commands WR CMD 1, 2, 3 in command queue 985 are stored separately in RAM buffer 966. Read command RD CMD 4 reads WR DATA 2 from RAM buffer 966, while RD CMD 5 reads WR DATA 3 from RAM buffer 966.

Figure 24:
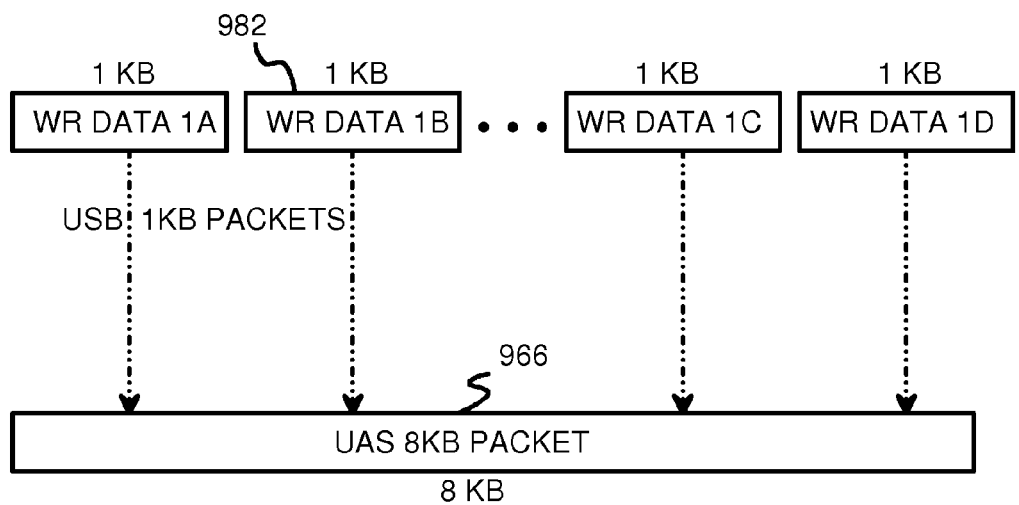
FIG. 24 highlights merging 1 KB USB packets to form 8 KB payloads for writing to flash memory.

FIG. 24 highlights merging 1 KB USB packets to form 8 KB payloads for writing to flash memory. USB 3.0 packets are limited to 1 KB and USB 2.0 packets are limited to 512 bytes. These smaller packets are sent through data-out pipe 982. However, the flash memory system has wider datapaths and large blocks of flash memory and is more efficient using a larger payload size. Up to 8 of the 1 KB packets read from data-out pipe 982 are merged into one 8 KB payload in RAM buffer 966. Then the 8 KB payload is transferred to the flash memory controllers for writing to blocks of flash memory.

Figure 25A:
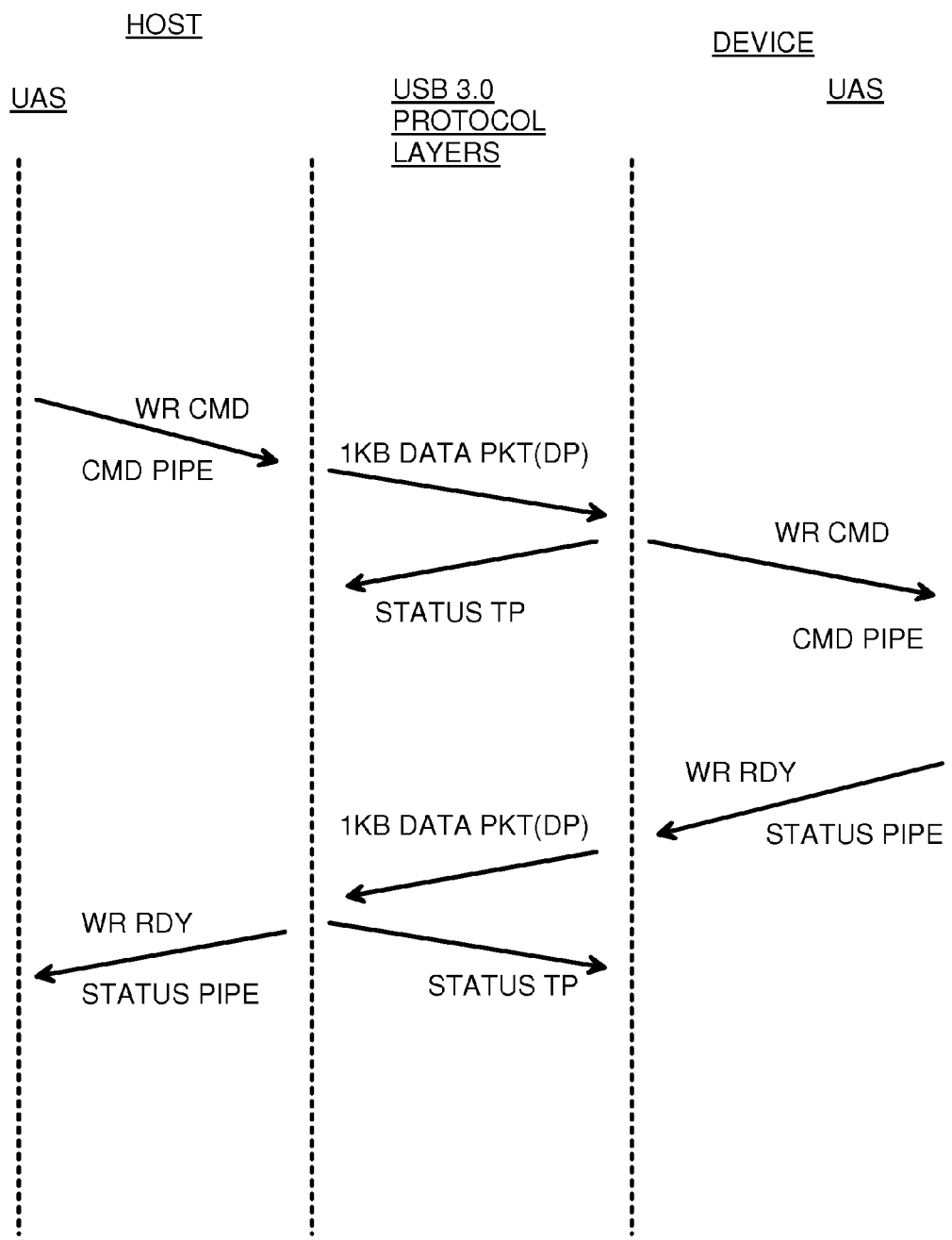
FIGS. 25A-B show message passing using UAS and USB protocols.
Figure 25B:
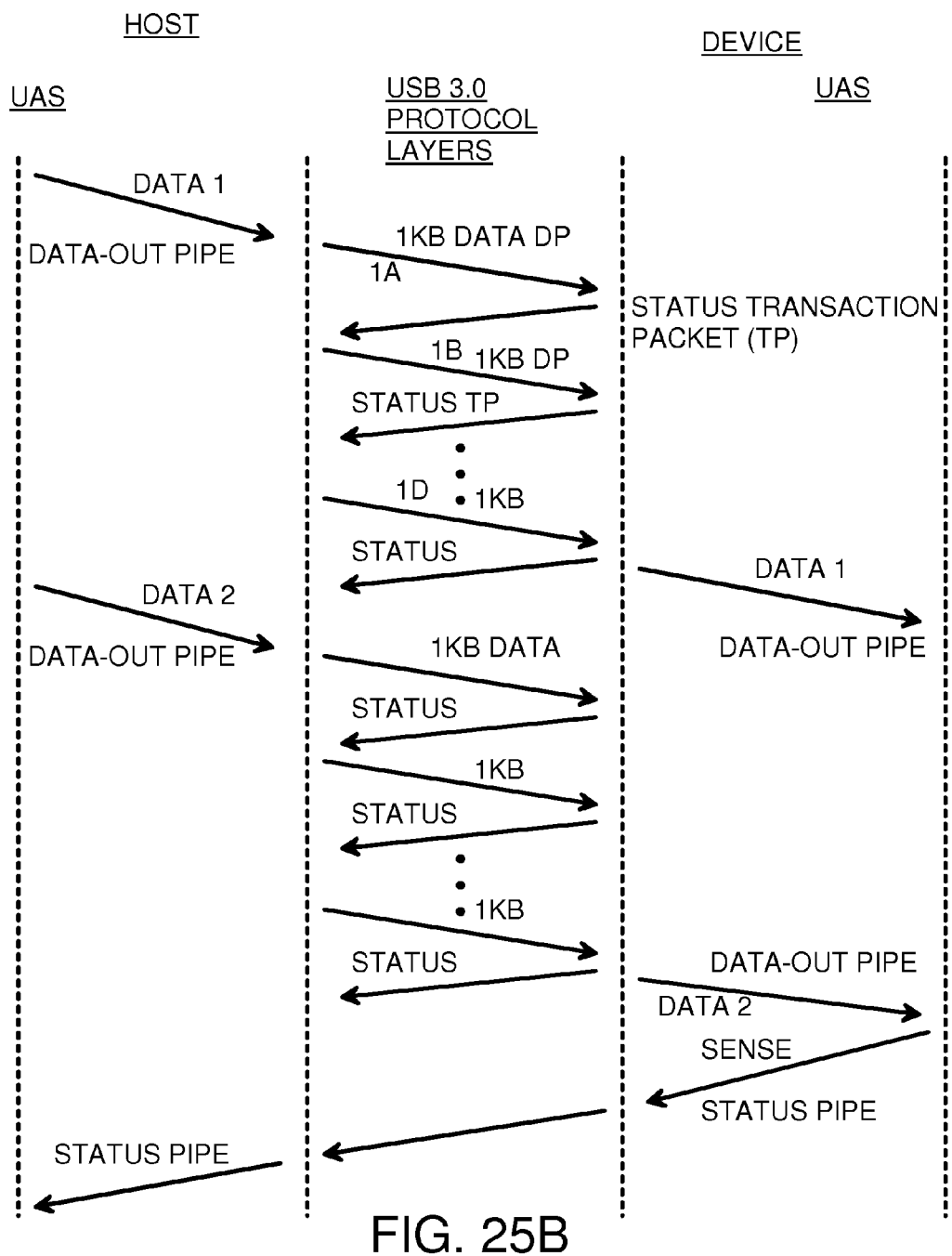

FIGS. 25A-B show message passing using UAS and USB protocols. In FIG. 25A, the host uses the UAS protocol to create a write command. The UAS write command is sent to a USB protocol layer than creates a 1 KB or smaller USB data packet (DP) that is sent over the physical interface from the host to the device.

The device responds by sending a USB status transaction packet (TP) back to the host over the physical interface to acknowledgement receipt of the USB packet. The device extracts the UAS command from the USB packet and transfers the UAS write command to the command pipe to the UAS protocol layer for processing.

The UAS layer on the device generates a ready RDY message that is sent through the status pipe and encapsulated as a USB data packet to the host. The host responds to this USB data packet with a USB status transaction packet (TP) back to the device over the physical interface to acknowledgement receipt of the USB packet. The host extracts the UAS ready from the USB packet and transfers the UAS ready message to the host's status pipe.

In FIG. 25B, the host responds by sending data to the device. The data is divided into 2 packages: DATA 1 and DATA 2 that are sent out the host's data-out pipe as 2 separate transfers. The host's USB layer divided each data package into several smaller 1 KB USB data packets that are sent over the physical interface to the device. The device responds to each packet with a USB status transaction packet (TP) back to the host over the physical interface to acknowledgement receipt of the USB packet.

The device extracts the data from the USB packets from data-out pipe 982 and combines them into a larger 8 KB package that is stored in RAM buffer 966. Once both of the DATA 1 and DATA 2 packages are recovered by the device, the device generates a SENSE message to the host that is loaded into status pipe 978, then encapsulated as a USB packet and sent to the host. The host extracts the SENSE message and sends it to the host's UAS layer processor.

Figure 26:
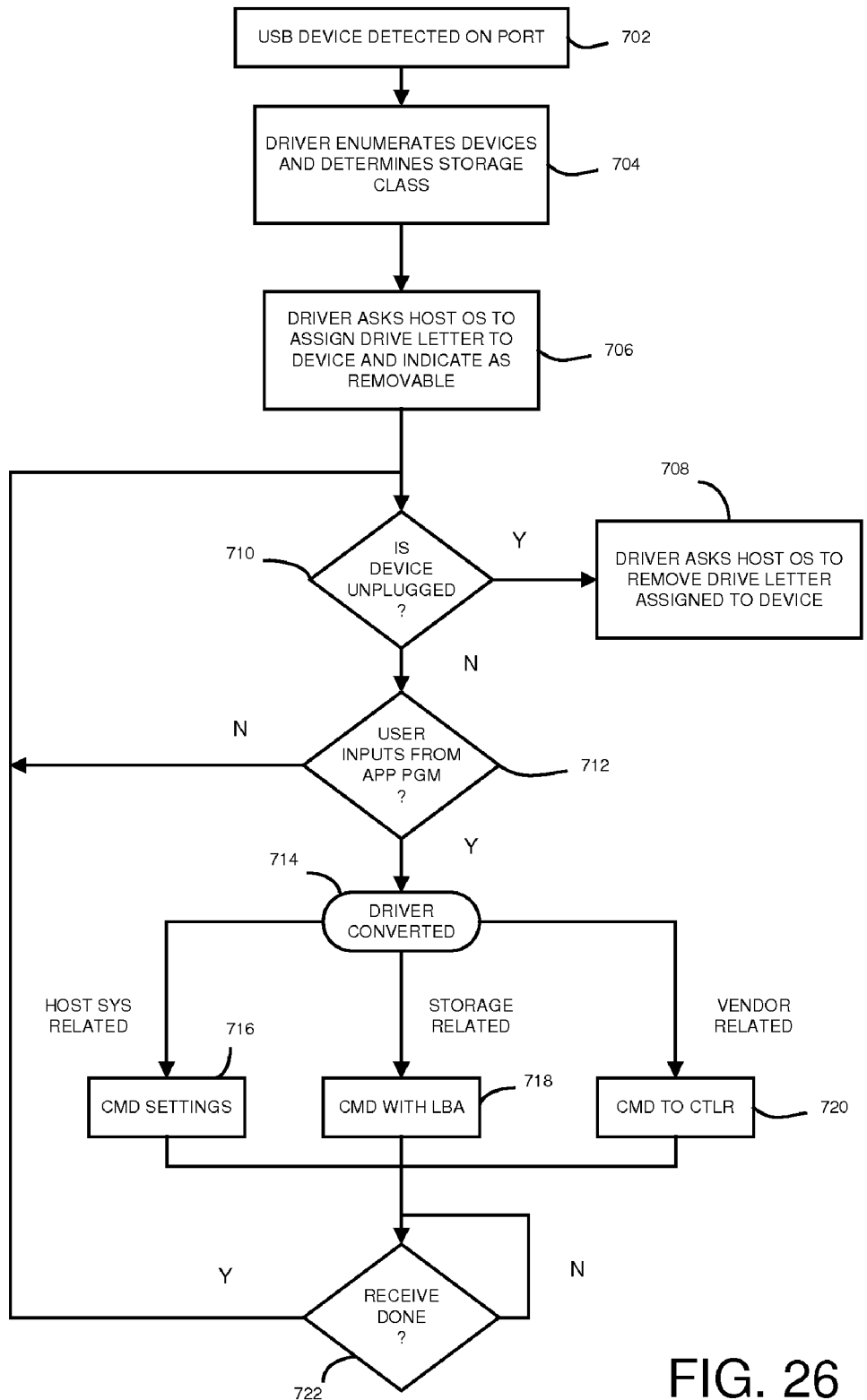
FIG. 26 is a flowchart of host operation.

FIG. 26 is a flowchart of host operation. A USB device is detected on a host port, step 702. The host driver enumerates the device and determines the storage class, step 704. The driver asks the host OS to assign a drive letter to the device and mark it as a removable drive, step 706. When the device is unplugged, step 710, then the driver asks the host OS to remove the drive letter assigned to the device, step 708.

When the user activates controls or other inputs from an application program to store contents to the device, step 712, the driver converts the data for transmission to the device. When the content is host-system related, the command generated by the host indicates the command settings, step 716. When the content is storage related, the command indicates that the flash is read or written using the LBA-to-PBA mapping, step 718. When the content is vendor related, the command to the controller is sent, step 720.

Once the content data has been transferred from the host to the device, step 772, the process can repeat from step 710. When no user controls or inputs occur, step 712, the process can repeat from step 710.

Figure 27:
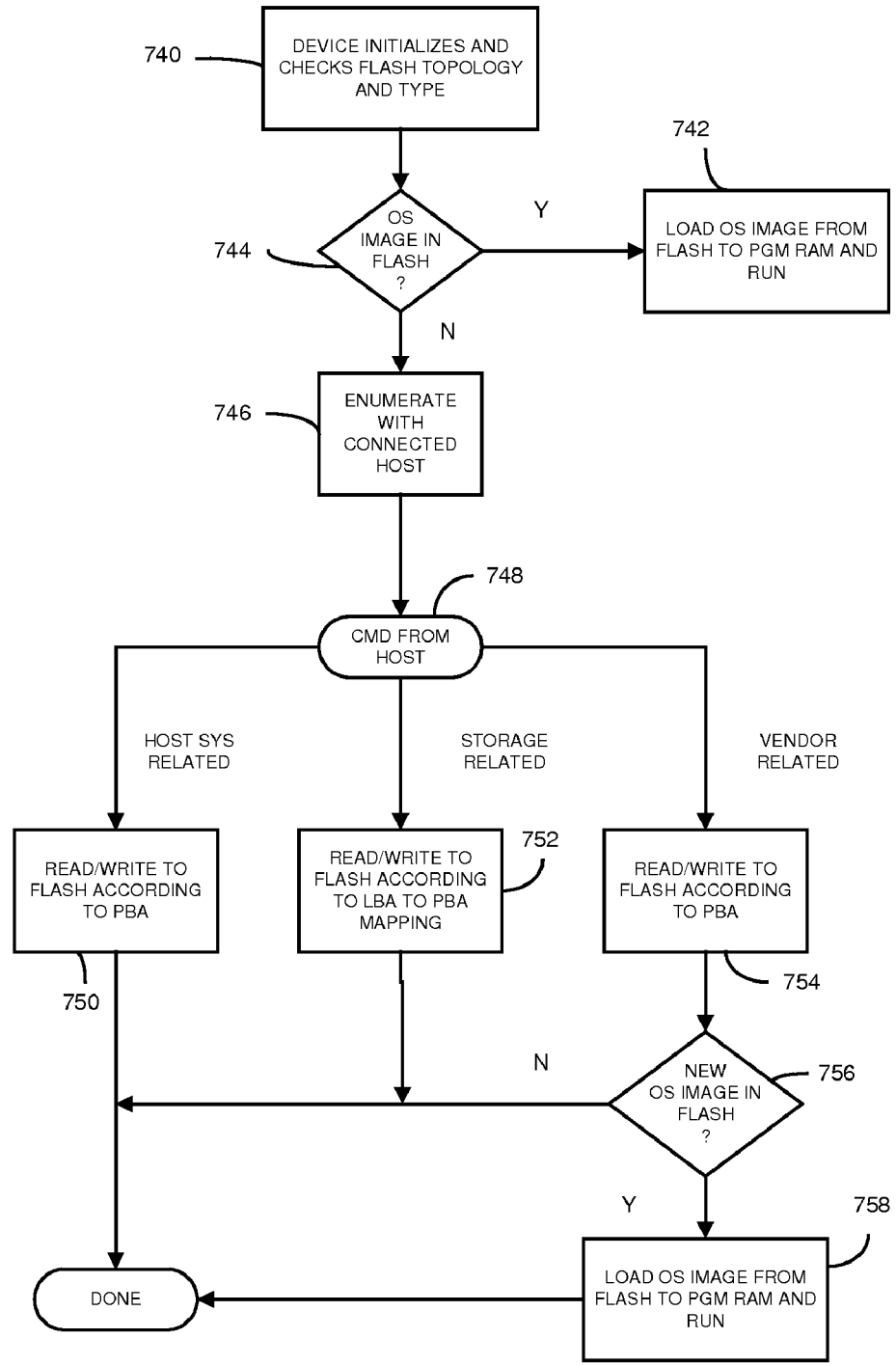
FIG. 27 is a flowchart of device operation.

FIG. 27 is a flowchart of device operation. When the device is powered up by plugging into the host, it initializes and checks its flash topology and type, step 740. When the OS image is stored in the flash, step 744, then the OS image is read from the flash storage, step 742 and written into the program RAM and executed.

The device is enumerated by the host, step 746, and a command from the host is received, step 748. When the command is host-system related, the flash is read or written using the PBA, step 750. When the command is storage related, the flash is read or written using the LBA-to-PBA mapping, step 752. When the command is vendor related, the flash is read or written using the PBA, step 754. When the new OS image is stored in the flash, step 756, then the OS image is read from the flash storage and written into the program RAM and executed, step 758. Other commands can then be processed from step 748.

Figure 28:
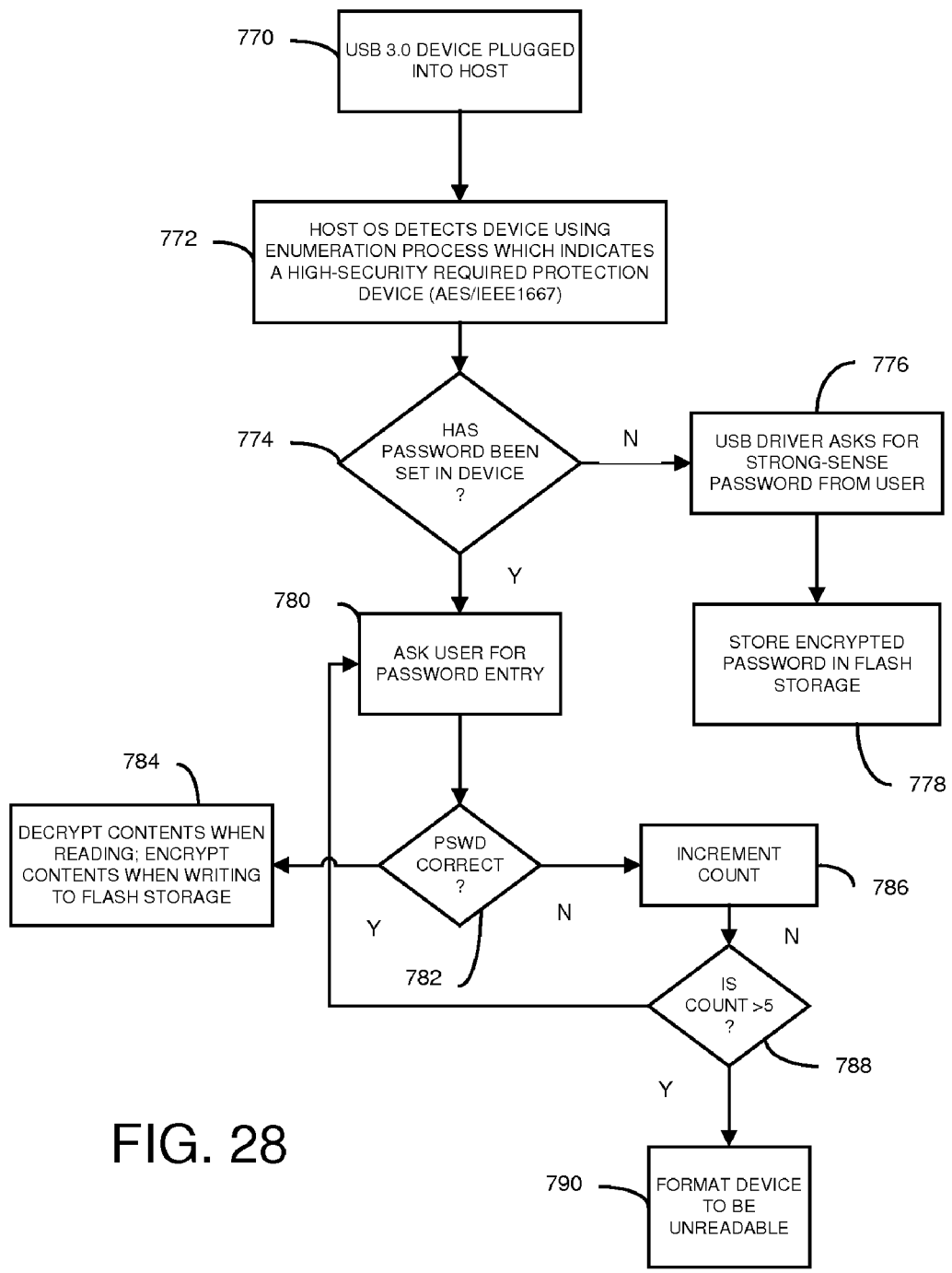
FIG. 28 is a flowchart of security operations.

FIG. 28 is a flowchart of security operations. This process can be performed by firmware 35 of FIG. 2. The host detects a USB 3.0 device plugged into a port, step 770. During an enumeration process, the host detects that the device is a high-security device such as an Advanced Encryption Standard (AES) 128/192/256 or IEEE 1667 device with a digital signature method AES or IEEE 1667 device, step 772.

If the password has not been set in the device, step 774, a USB 3.0 driver on the host can ask the user for a strong password, step 776, which is encrypted and stored by the device, step 778. When a password has already been set on the device, step 774, the host can ask for the password from the user, step 780, and verify the entered password to the stored encrypted password, step 782 before the contents of the device are accessible to the host. Contents are decrypted when reading, and encrypted when writing, step 784.

When a password does not verify, step 782, a count is incremented, step 786, and compared to a count limit, step 788. When too many password mismatches occur, such as 5, then the device can format itself to make its contents unreadable such as by formatting itself, step 790.

Alternate Embodiments

Several other embodiments are contemplated by the inventors. For example, various bus topologies and arrangements of NVMS, flash memory, controllers, etc. are possible. USB 3.0 may be modified, or other versions of USB may be modified. A variety of bus timings and sequences may be supported.

The host may enter a suspend or sleep mode when the NRDY signal is received. This sleep mode of the host may be with respect to the target EUSB device, rather than to all USB devices. For example, the host may have several channels, each performing a transaction with a different EUSB device. Only channels to busy EUSB devices are suspends; other channels from the host may continue operation. Since transfers that are suspended may be re-started by the host, the state of the current transfer does not have to be saved when the host goes into suspend mode. Not having to save state variables can reduce the complexity of the host's suspend mode Instead of USB or other differential buses mentioned above, SD, MicroSD, MMC, or microMMC interfaces can also be applied in this invention. Rather than use SD buses, other buses may be used such as Memory Stick (MS), CompactFlash (CF), IDE bus, etc. Additional pins can be added or substituted. A multi-bus-protocol chip could have an additional personality pin to select which bus interface to use, or could have programmable registers.

While a sector size of 512 bytes has been described, the page size may have another size, such as 1K, 2K, 4K, 8K, etc. Flash blocks may have 4 pages, 8 pages, 64 pages, or some other number, depending on the physical flash chips and arrangement used.

While the invention has been described using an USB controller, a SD, MMC, PCIE, or other controller may be substituted. A combined controller that can function for multiple interfaces may also be substituted.

Mode logic could sense the state of a pin only at power-on rather than sense the state of a dedicated pin. A certain combination or sequence of states of pins could be used to initiate a mode change, or an internal register such as a configuration register could set the mode.

The microcontroller, UAS, and USB components such as the protocol layers, bus interfaces, DMA, flash-memory controller, transaction manager, and other controllers and functions can be implemented in a variety of ways. Functions can be programmed and executed by the CPU or other processor, or can be implemented in dedicated hardware, firmware, or in some combination. Many partitioning of the functions can be substituted.

Data and commands may be routed in a variety of ways, such as through data-port registers, FIFO or other buffers, the CPU's registers and buffers, DMA registers and buffers, and flash registers and buffers. Some buffers may be bypassed or eliminated while others are used or present. Virtual or logical buffers rather than physical ones may also be used. Data may be formatted in a wide variety of ways.

The host can transfer standard USB commands and data transactions to the USB transceiver during a transaction, or may switch to EUSB mode to save power. Other transaction types or variations of these types can be defined for special purposes. These transactions may include a flash-controller-request, a flash-controller-reply, a boot-loader-request, a boot-loader-reply, a control-program-request, a control-program-reply, a flash-memory-request, and a flash-memory-reply. The flash-memory request/reply may further include the following request/reply pairs: flash ID, read, write, erase, copy-back, reset, page-write, cache-write and read-status. Special commands for use with UAS may also be developed.

The host may be a personal computer (PC), a portable computing device, a digital camera, a phone, a personal digital assistant (PDA), or other electronic device. The partition of RAM among various functions could change over time.

Wider or narrower data buses and flash-memory blocks could be substituted, such as 4, 5, 8, 16, 32, 64, 128, 256-bit, or some other width data channels. Alternate bus architectures with nested or segmented buses could be used internal or external to the microcontroller. Two or more internal and flash buses can be used in the USB flash microcontroller to increase throughput. More complex switch fabrics can be substituted for the internal buses. Redundant Array of Individual Disks (RAID) can be supported by redundant storage in channels or flash devices. While combining 1 KB USB packets into 8 KB payloads has been described, other payload and packet sizes could be substituted. Some packets may be smaller than the maximum size, and there may be empty space in payloads, or payloads may have a variable size.

The physical layer can receive physical signals with a predetermined pin assignment. The predetermined pin assignment may be based on a pin count of the flash-memory card. The pin assignment may include one set of two pairs of differential serial buses: (i) a first pair differential serial bus with a first pin carry + signal and a second pin carry − signal, and (ii) a second pair differential serial bus with a first pin carry + signal and a second pin carry − signal. In an alternative design, extra pairs of differential serial bus can increase performance by adding pairs of such high speed serial differential signal lines.

The flash mass storage chips or blocks can be constructed from any flash technology including multi-level-logic (MLC) memory cells and single level cells (SLC). Phase change memory may be used as flash memory. Data striping could be used with the flash mass storage blocks in a variety of ways, as can parity and error-correction code (ECC). Data re-ordering can be adjusted depending on the data arrangement used to prevent re-ordering for overlapping memory locations. A hub or switch such as port multiplier 318 (FIG. 19B) could be integrated with other components such as the Smart Storage Switch or could be a stand-alone chip. The hub/switch could also be integrated with the UAS/USB single-chip flash device. While a single-chip device has been described, separate packaged chips or die may be stacked together while sharing I/O pins, or modules may be used.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A USB-Attached-SCSI (UAS) and Bulk-Only-Transfer (BOT) flash-memory card comprising:
    a Universal-Serial-Bus (USB) connector for connecting to a host;
    a physical layer, coupled to the USB connector, for generating and receiving physical signals through the USB connector;
    a data link layer, coupled to the physical layer, for arranging data packets in a sequence sent through the USB connector;
    a protocol layer, coupled to the data link layer, for extracting data and commands from data packets received through the USB connector, and for sending data and status messages through the USB connector;
    a UAS/BOT detector for signaling a UAS mode when a UAS identifier and a UAS operation code are detected in a command received by the protocol layer;
    a data-out pipe, coupled to receive data packets from the protocol layer, for storing data packets received from the host through the USB connector;
    a data-in pipe, coupled to send data packets to the protocol layer, for storing data packets for transmission to the host through the USB connector;
    a command pipe, coupled to receive commands from the protocol layer when the UAS mode is signaled, for storing commands received from the host through the USB connector when operating in UAS mode; and
    a status pipe, coupled to send status messages commands to the protocol layer when the UAS mode is signaled, for storing status messages for transmission to the host through the USB connector when operating in UAS mode;
    wherein the data-out pipe is further for storing commands when the UAS mode is not signaled and the UAS/BOT flash memory device is operating in a BOT mode;
    wherein the data-in pipe is further for storing status messages when the UAS mode is not signaled and the UAS/BOT flash memory device is operating in the BOT mode,
    whereby commands are stored in the command pipe when the UAS mode is signaled, and are stored in the data-out pipe when the UAS mode is not signaled.

2. The UAS and BOT flash-memory card of claim 1 further comprising:
    a smart storage switch for controlling a plurality of Non-Volatile Memory Devices (NVMD) that store data, the smart storage switch receiving the data packets stored in the data-out pipe and writing data to the plurality of NVMD in response to a write command, and the smart storage switch reading data from the plurality of NVMD and sending the data packets to the data-in pipe and in response to a read command.

3. The UAS and BOT flash-memory card of claim 2 further comprising:
    a random-access memory (RAM) buffer, coupled between the smart storage switch and the data-in pipe and the data-out pipe, the RAM buffer for buffering data packets for transfer to the smart storage switch.

4. The UAS and BOT flash-memory card of claim 3 wherein data packets written to the RAM buffer from the data-out pipe are merged into a data payload that is sent to the smart storage switch;
    wherein the RAM buffer receives data payloads from the smart storage switch, and writes data packets to the data-in pipe;
    wherein the data payloads have a maximum capacity that is at least 8 times a maximum capacity of the data packets,
    whereby larger data payloads are transferred to and from the smart storage switch.

5. The UAS and BOT flash-memory card of claim 4 further comprising:
    a control pipe, coupled to the protocol layer, for storing control messages sent through the USB connector from the host, and for sending the control messages to the smart storage switch.

6. The UAS and BOT flash-memory card of claim 4 further comprising:
    a command/status buffer, in a RAM containing the RAM buffer, for storing commands for transfer from the command pipe and for storing status messages for transfer to the status pipe;
    wherein commands and status messages are buffered by the command/status buffer for transfer to the smart storage switch.

7. The UAS and BOT flash-memory card of claim 4 further comprising:
    an encryptor/decryptor, in the smart storage switch, for encrypting data in data payloads before writing the data payloads to the plurality of NVMD, and for decrypting data payloads read from the plurality of NVMD before transfer to the RAM buffer.

8. The UAS and BOT flash-memory card of claim 4 wherein the commands stored in the command pipe contain a starting logical block address (LBA) and a data transfer length;
   wherein the smart storage switch sends a modified LBA to the plurality of NVMD, wherein the modified LBA is the starting LBA that is re-mapped by the smart storage switch,
   whereby the smart storage switch re-maps LBA's.

9. The UAS and BOT flash-memory card of claim 8 further comprising:
   a command queue, coupled to the protocol layer, for storing commands sent by the host over the USB connector, the command queue storing the starting LBA and data transfer length for recent commands to identify data dependencies;
   wherein an execution order of commands in the command queue is re-ordered for processing by the smart storage switch relative to an order received from the host,
   whereby commands are reordered.

10. The UAS and BOT flash-memory card of claim 4 wherein the UAS/BOT detector signals BOT mode when the host connected to the USB connector is a USB version 2.0 host that does not support USB version 3.0 data packets.

11. The UAS and BOT flash-memory card of claim 4 wherein the plurality of NVMD are connected to the smart storage switch using a Serial AT-Attachment (SATA) bus,
   wherein the plurality of NVMD are SATA NVMD.

12. The UAS and BOT flash-memory card of claim 4 wherein the plurality of NVMD are arranged into multiple channels that are simultaneously accessible by the smart storage switch.

13. The UAS and BOT flash-memory card of claim 4 wherein the data payloads are stored redundantly in the plurality of NVMD in a Redundant Array of Individual Disks (RAID) configuration,
   wherein the smart storage switch further comprises a RAID controller for redundantly dispatching data to the plurality of NVMD.

* * * * *